(12) United States Patent
Kawai

(10) Patent No.: US 6,734,561 B2
(45) Date of Patent: May 11, 2004

(54) SEMICONDUCTOR DEVICE AND A METHOD OF PRODUCING THE SAME

(75) Inventor: Kenji Kawai, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/572,874

(22) Filed: May 18, 2000

(65) Prior Publication Data

US 2003/0137051 A1 Jul. 24, 2003

(30) Foreign Application Priority Data

Dec. 22, 1999 (JP) ............................................. 11-363933

(51) Int. Cl.[7] ........................ H01L 23/48; H01L 21/44; H01L 21/4763
(52) U.S. Cl. ..................... 257/758; 257/760; 257/762; 257/765; 257/774; 257/296; 438/118; 438/622; 438/623; 438/624; 438/637; 438/638
(58) Field of Search ................................ 257/758, 575, 257/586, 578, 592, 577, 760, 437, 704, 296, 762, 765, 774; 438/622–624, 634, 118, 637, 638

(56) References Cited

U.S. PATENT DOCUMENTS

| 5,081,060 | A | | 1/1992 | Kim | |
|---|---|---|---|---|---|
| 5,243,221 | A | * | 9/1993 | Ryan et al. | 257/767 |
| 5,869,393 | A | * | 2/1999 | Tseng | 438/622 |
| 6,028,360 | A | * | 2/2000 | Nakamura et al. | 257/758 |
| 6,100,117 | A | * | 8/2000 | Hao et al. | 438/132 |
| 6,130,449 | A | * | 10/2000 | Matsuoka et al. | 257/296 |
| 6,174,803 | B1 | * | 1/2001 | Harvey | 438/638 |
| 6,207,986 | B1 | * | 3/2001 | Yamanaka et al. | 257/296 |
| 6,261,944 | B1 | * | 7/2001 | Mehta et al. | 438/624 |

FOREIGN PATENT DOCUMENTS

| JP | 8-37181 | | 7/1994 |
|---|---|---|---|
| JP | 8-37181 A | * | 2/1996 |

* cited by examiner

Primary Examiner—Donghee Kang
(74) Attorney, Agent, or Firm—McDermott, Will & Emery

(57) ABSTRACT

An anti-reflection coating 5 used at time of forming a first contact hole 6 is interposed between a first insulating layer 4 and a second insulating layer 80, and the anti-reflection coating 5 is served as an etching prevention film for the first insulating layer 4 at time of forming a second contact hole 9 in the second insulating layer 80, whereby an electrical short between a conductive plug and an electrode layer is prevented; an electrical connection between upper and lower conductive plugs is stabilized; and a semiconductor device having a highly reliable contact structure, in which multi-layer conductive plugs are included, is obtainable.

4 Claims, 23 Drawing Sheets

F I G. 3 a
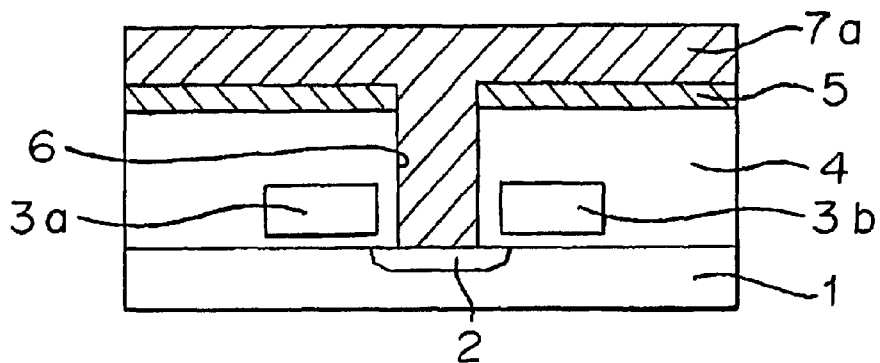
F I G. 3 b
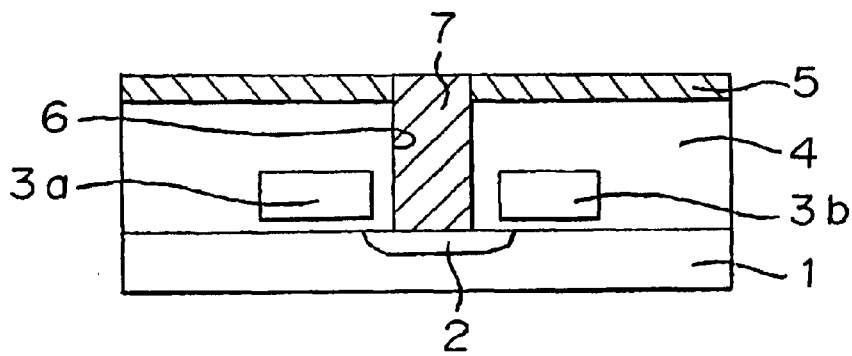
F I G. 3 c
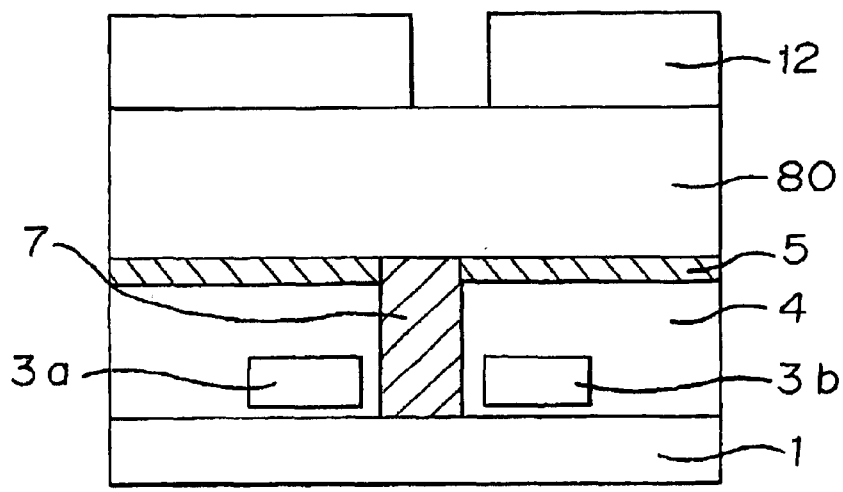

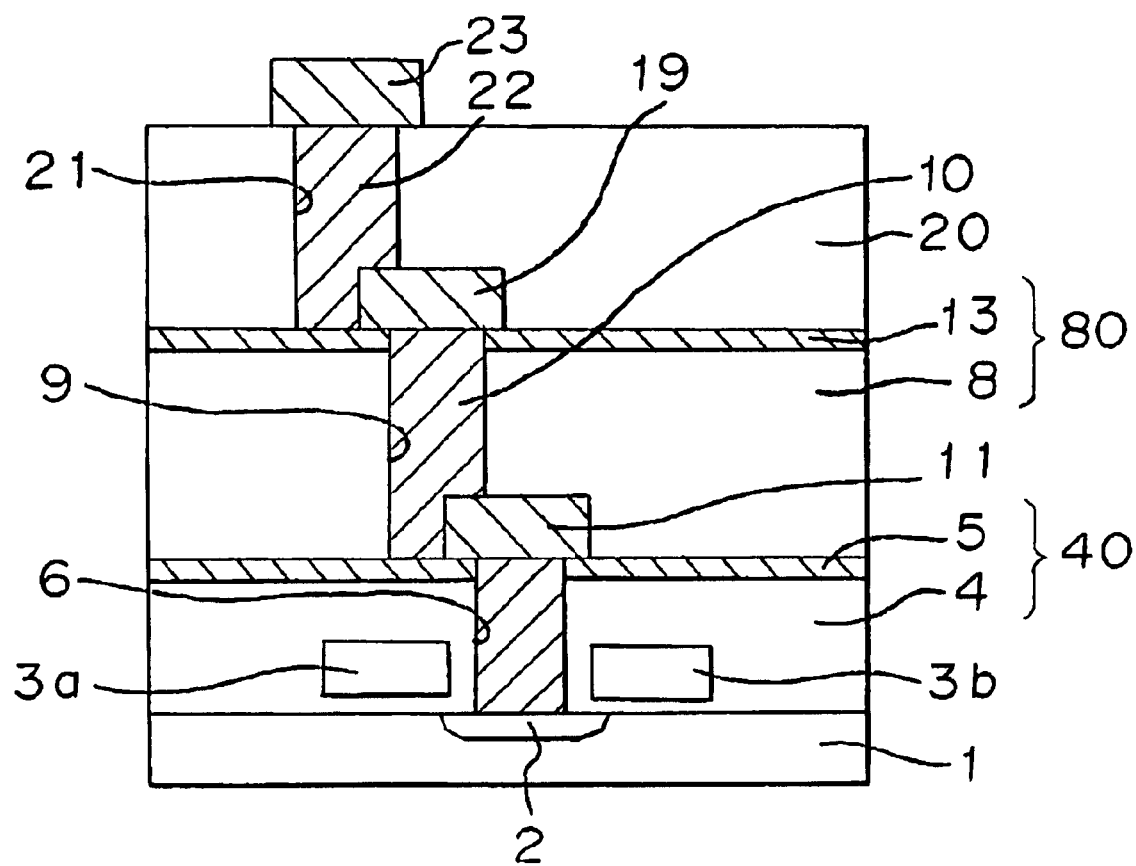
F I G. 12

SEMICONDUCTOR DEVICE AND A METHOD OF PRODUCING THE SAME

BACKGROUND OF THE INVENTION

1. Field of the Invention

The present invention relates to a semiconductor device and a method of producing the semiconductor device, in particular, to a semiconductor device having a contact structure utilizing a multi-layer conductive plug and a method of producing the semiconductor device.

2. Discussion of Background

In recent years, a size of a contact hole is reduced along with microminituarization of a semiconductor integrated circuit. As a result, it becomes difficult to form a resist pattern, and etching using this resist pattern as a mask becomes difficult by an increment of an aspect ratio of the contact hole.

In order to reduce the aspect ratio and a load in etching, there has been proposed a method of obtaining a contact structure by dividing an inter-layer insulating film into multi layers, forming a contact hole in each of the multi layers, and vertically connecting conductive plugs embedded in the contact holes.

However, according to these methods, misregistration between the horizontally arranged contact holes is apt to occur, an insulating film in a lower layer is etched at time of forming the contact hole in an insulating film in an upper layer by etching. Further, in a worse case, the contact hole in the upper layer reaches an electrode layer located in the insulating film in the lower layer, whereby an electric short is caused.

In order to solve such a problem, in Japanese Unexamined Patent Publication JP-A-8-37181, a contact structure, in which an etching prevention film is interposed between an insulating film in an upper layer and an insulating film in a lower layer, is disclosed.

In other words, in reference of a cross-sectional view in a step of a process illustrated in FIG. 22 of the above JP-A-8-37181, even though an upper insulating film 108 is disposed on a lower insulating film 104 through an etching prevention film 105, and succeedingly an upper layer contact hole 109 formed on the upper insulating film 108 is deviated from a lower contact hole 106 so that a part of the upper contact hole 109 reaches a lower layer insulating film 104 by etching, the lower layer insulating film 104 is not etched, whereby the upper layer contact hole 109 does not reach electrode layers 103a, 103b on a semiconductor substrate 101.

However, in a conventional technique disclose in the above JP-A-8-37181, when a semiconductor device is further integrated and a size of a contact hole is further microminiaturized, a good contact hole cannot be formed because dimensional controllability and a shape of a resist pattern, which is formed on an etching prevention film, are deteriorated. Therefore, there are problems that a dimensional accuracy and a shape of a conductive plug formed in the contact hole are deteriorated, and a stable electrical connection between upper and lower conductive plugs is not obtainable.

Incidentally, in the above JP-A-8-37181, a method of forming the etching prevention film after forming the conductive plug is disclosed. According to such a process, it is possible to prevent the etching prevention film from thinning at time of forming the conductive plug by etching.

In other words, in reference of a cross-sectional view explaining a step of a process of manufacturing the semiconductor device, after forming the lower layer insulating film 104 including a conductive plug 107 formed in the lower layer contact hole 106, an etching prevention film 124 is formed, and further an insulating film 108 including an upper layer contact hole 109 is formed on the etching prevention film 124. The etching prevention film 124 prevents etching to the lower layer insulating film 104 when the upper layer contact hole 109 is formed with a deviation from the lower layer contact hole 106. Thereafter, as illustrated in FIG. 23(b), the etching prevention film 124 exposed inside the upper layer contact hole 109 is etched so as to be connected to the lower layer film conductive plug 107. Thereafter, an upper layer conductive plug 110 is embedded in an upper layer contact hole 109 so as to be connected to the lower layer conductive plug 107.

However, in such a method of forming, as illustrated in FIG. 24(a), a problem occurs when a surface of the lower layer conductive plug 107 is formed with a large drop 172 with respect to a surface of the lower layer insulating film 104. Namely, the etching prevention film 124 has an uneven shape reflecting a shape of the drop. When the upper layer insulating film 108 and upper layer contact hole 109 connected to the conductive plug 107 are formed, there are problems that a part of the etching film 124 which is formed on a side surface of the drop 172 is left on the conductive plug 107 as a residue 182, and a contact resistance between the upper layer conductive plug 110 embedded in the upper layer contact hole 109 and the lower layer conductive plug 107 is increased as illustrated in FIG. 24(b).

A reason why the drop 172 occurs in the conductive plug 107 is to over-etch or over-polish so that the conductive plug is securely embedded in an entire area of a wafer surface in consideration of uniformity of a film thickness on a surface of the wafer at time of forming the conductive plug or uniformity of an etching rate or, uniformity of polishing rate on the wafer surface.

SUMMARY OF THE INVENTION

It is an object of the present invention to solve the above-mentioned problems inherent in the conventional technique and to provide a semiconductor device having a contact structure comprising multi-layer conductive plugs, by which a short between the conductive plug and an electrode layer is prevented, and an electrical connection between upper and lower conductive plugs is stabilized to improve the reliability.

Another object of the present invention is to provide a semiconductor device including a contact structure of a capacitor comprising multi-layer conductive plugs, by which shorts between a capacitor electrode and an electrode layer and between the conductive plug and the electrode layer are prevented, and an electrical connection between upper and lower conductive plugs is stabilized to improve reliability.

Another object of the present invention is to provide a semiconductor device including a multi-layer wiring structure using a conductive plug, by which a short between the conductive plug and an electrode layer is prevented and an electrical connection between the conductive plug and a wiring layer is stabilized to improve reliability.

Another object of the present invention is to provide a method of producing a semiconductor device including a contact structure comprising multi-layer conductive plugs, by which a short between the conductive plug and an electrode layer is prevented, and a contact resistance between upper and lower conductive plugs is reduced.

According to a first aspect of the present invention, there is provided a semiconductor device comprising an electrode formed on a part of a semiconductor layer, a first insulating layer including a first insulating film and a first anti-reflection coating formed on the first insulating film, a first contact hole formed in the first insulating layer and reaching the semiconductor layer by penetrating a vicinity of side surface of the electrode layer from a surface of the first insulating layer, a first conductive plug embedded in the first contact hole and electrically connected to the semiconductor layer, a second insulating layer formed by covering the first insulating layer and the first conductive plug, a second contact hole formed in the second insulating layer and reaching the first conductive plug and the first insulating layer from a surface of the second insulating film, a second conductive plug embedded in the second contact hole and electrically connected to the first conductive plug, and a conductive layer formed in the second conductive plug and electrically connected to the semiconductor layer through the first conductive plug and the second conductive plug.

According to a second aspect of the present invention, there is provided the semiconductor device, wherein the second insulating layer includes a second insulating film and a second anti-reflection coating formed on the second insulating film.

According to a third aspect of the present invention, there is provided the semiconductor device, further comprising a third insulating layer formed by covering the second insulating layer and the second conductive plug, and an opening provided in the third insulating layer, which opening reaches the second conductive plug from a surface of the third insulating layer, wherein the conductive layer is a capacitor electrode electrically connected to the semiconductor layer through the first conductive plug and the second conductive plug and formed in the opening.

According to a fourth aspect of the present invention, there is provided the semiconductor device comprising an electrode layer formed on a part of a semiconductor layer, a first insulating layer formed by covering the semiconductor layer and the electrode layer and by sequentially laminating a first insulating film and a first anti-reflection coating, a first contact hole formed in the first insulating layer and reaching the semiconductor layer by penetrating a vicinity of a side of the electrode layer from a surface of the first insulating layer, a first conductive plug embedded in the first contact hole and electrically connected to the semiconductor layer, a first wiring layer electrically connected to the semiconductor layer through the first conductive plug and formed on the first conductive plug, a second insulating layer formed by covering the first insulating layer and the first wiring layer, a second contact hole formed in the second insulating layer and reaching the first wiring layer and the first insulating layer from a surface of the second insulating layer, a second conductive plug embedded in the second contact hole and electrically connected to the first conductive layer, and a second wiring layer electrically connected to the first wiring layer through the second conductive plug and formed on the second conductive plug.

According to a fifth aspect of the present invention, there is provided the semiconductor device, wherein the second insulating layer includes a second insulating film and a second anti-reflection coating formed on the second insulating film.

According to a sixth aspect of the present invention, there is provided the semiconductor device, wherein the first anti-reflection coating and second anti-reflection coating are a silicon oxynitride film.

According to a seventh aspect of the present invention, there is provided a method of producing a semiconductor device comprising steps of: forming an electrode layer on a part of a semiconductor layer, forming a first insulating layer on the semiconductor layer and the electrode layer by sequentially laminating a first insulating film and a first anti-reflection coating, forming a resist film having a predetermined pattern on the first anti-reflection coating, etching the first insulating layer using the resist film as a mask and forming a first contact hole reaching the semiconductor layer by penetrating a vicinity of a side surface of the electrode layer, embedding to form a first conductive plug electrically connected to the semiconductor layer in the first contact hole, forming a second insulating layer on the first insulating layer and the first conductive plug, etching to form a second contact hole reaching the first anti-reflection coating and the first conductive plug in the second insulating layer using the first anti-reflection coating as an etching prevention film with respect to the first insulating film, embedding to form a second conductive plug electrically connected to the first conductive plug in the second contact hole, and forming a conductive layer electrically connected to the semiconductor layer through the first conductive plug and the second conductive plug on the second conductive plug.

According to an eighth aspect of the present invention, there is provided the method of producing the semiconductor device, wherein the step of forming the second insulating film includes a step of forming the second insulating film and a second anti-reflection coating by sequentially laminating these and a step of etching to form using a resist film formed on the second anti-reflection coating as a mask.

According to a ninth aspect of the present invention, there is provided the method of producing the semiconductor device further comprising steps of: forming a third insulating film on the second insulating layer and the second conductive plug, etching to form an opening reaching the second conductive plug using the second anti-reflection coating as an etching prevention film with respect to the second insulating film, wherein the conductive layer is a capacitor electrode formed in the opening and electrically connected to the semiconductor layer through the second conductive plug and the first conductive plug.

According to a tenth aspect of the present invention, there is provided the method of producing the semiconductor device, wherein the anti-reflection coatings are a silicon oxynitride film.

According to an eleventh aspect of the present invention, there is provided a method of producing a semiconductor device comprising steps of: forming an electrode layer on a part of a semiconductor layer, forming a first insulating layer on the semiconductor layer and the electrode layer, forming a first contact hole reaching the semiconductor layer by penetrating a vicinity of a side surface of the electrode layer in the first insulating layer, embedding to form a first conductive plug in the first contact hole, the first conductive plug is electrically connected to the semiconductor layer and a surface of the first conductive plug is recessed from a surface of the first insulating layer, processing to flatten the surfaces of the first insulating layer and the first conductive plug, forming a first etching prevention film on the flatten first insulating layer and the flatten first conductive plug, forming a second insulating layer on the first etching prevention film, forming a second contact hole reaching the first etching prevention film at a position overlapping at least the first conductive plug in the second insulating layer, etching the first etching prevention film exposed to a surface of the second contact hole and connecting the second contact hole to the first conductive plug, embedding to form a second conductive plug electrically connected to the first conductive plug in the second contact hole, and forming a conductive layer electrically connected to the semiconductor layer through the first conductive plug and the second conductive plug on the second conductive plug.

According to a twelfth aspect of the present invention, there is provided the method of producing the semiconductor device further comprising steps of: processing to flatten surfaces of the second insulating layer and the second conductive plug, forming a second etching prevention film on the flattened second insulating layer and the flattened second conductive plug, forming a third insulating layer on the second etching prevention film, forming an opening reaching the second etching prevention film at a position overlapping at least the second conductive plug in the third insulating layer, etching the second etching prevention film exposed to a surface of the opening and connecting the opening to the second conductive plug, wherein the conductive layer is a capacitor electrode formed in the opening and electrically connected to the semiconductor layer through the first conductive plug and the second conductive plug.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3a is a cross-sectional view of the semiconductor device in a step of producing this according to Embodiment 1 of the present invention;

FIG. 3b is a cross-sectional view of the semiconductor device in a step of producing this according to Embodiment 1 of the present invention;

FIG. 3c is a cross-sectional view of the semiconductor device in a step of producing this according to Embodiment 1 of the present invention;

FIG. 12 is a cross-sectional view of a semiconductor device according to Embodiment 4 of the present invention;

DETAILED DESCRIPTION OF THE PREFERRED EMBODIMENTS

A detailed explanation will be given of preferred embodiments of the present invention in reference to FIGS. 1 through 21 as follows, wherein the same numerical references are used for the same or similar portions and description of these portions is omitted.

Embodiment 1

Figure 1:
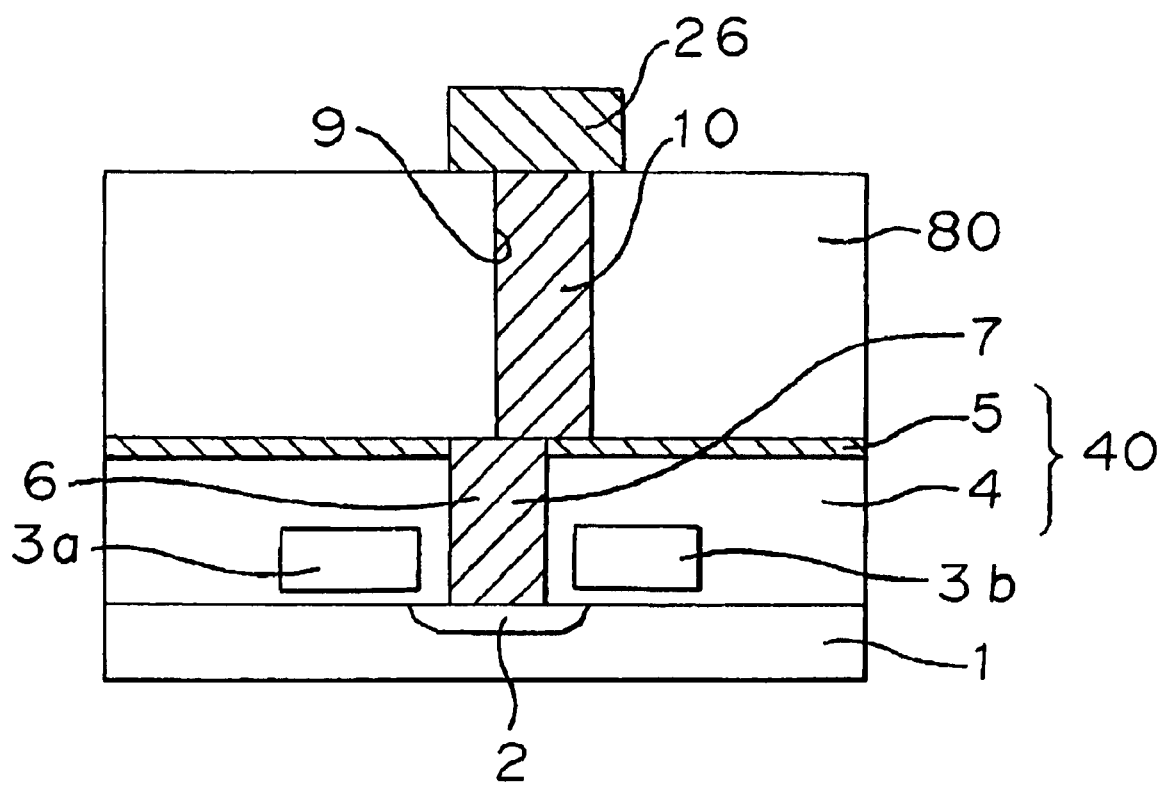
FIG. 1 is a cross-sectional view of a semiconductor device according to Embodiment 1 of the present invention.

FIG. 1 is a cross-sectional view of a semiconductor device according to Embodiment 1 of the present invention.

In FIG. 1, numerical reference 1 designates a semiconductor substrate as a semiconductor layer; numerical reference 2 designates a source drain area formed in the semiconductor substrate 1; and numerical references 3a, 3b designate gate electrodes as electrode layers formed on the semiconductor substrate 1 through a gate insulating film (not shown), wherein a transistor element is fabricated by the source drain area 2 and the gate electrodes. Numerical reference 40 designates a first insulating layer formed by a first insulating film 4, formed on the semiconductor substrate 1 and the gate electrodes 3a, 3b, and a first anti-reflection coating 5 formed on the first insulating film 4. Numerical reference 6 designates a first contact hole formed in the first insulating layer 40 and reaching the source drain area 2 by penetrating between the gate electrodes 3a and 3b. Numerical reference 7 designates a first conductive plug embedded in the first contact hole 6.

Numerical reference 80 designates a second insulating layer formed on the first anti-reflection coating 5 and the first conductive plug 7. Numerical reference 9 designates a second contact hole, formed in the second insulating layer 80 and reaching the first conductive plug 7 and the first anti-reflection coating 5. Numerical reference 10 designates a second conductive plug embedded in the second insulating layer 80. Numerical reference 26 designates a wiring layer as a conductive layer, which is formed on the second conductive plug 10 and electrically connected to the source drain area 2 through the second conductive plug 10 and the first conductive plug 7.

In the semiconductor device, the wiring layer 26 and the source drain area 2 are electrically connected through a contact structure, in which the conductive plug 7 and the conductive plug 10, respectively formed in the first insulating layer 40 and the second insulating layer 80, are connected.

In the next, a method of producing the semiconductor device illustrated 1 will be described in reference of cross-sectional views in steps of producing the semiconductor device illustrated in FIGS. 2a through 4b.

Figure 2A:
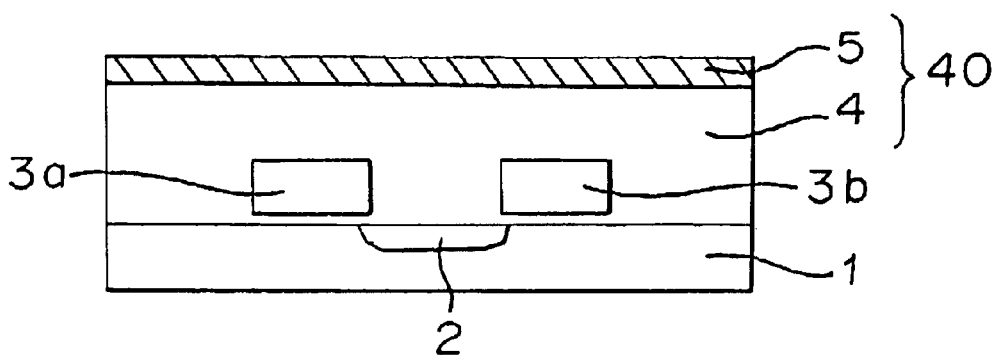
FIG. 2a is a cross-sectional view of a semiconductor device in a step of producing this according to Embodiment 1 of the present invention.

In FIG. 2a, the first insulating layer 40 is formed on the semiconductor substrate 1, made of silicon, and the electrode layers 3a and 3b by sequentially laminating the first insulating film 4, made of Borophospho Tetra Ethyl Ortho Silicate (BPTEOS) having a thickness of 1000 nm, and the first anti-reflection coating 5, made of a silicon oxynitride film having a thickness of 20 through 150 nm, respectively in use of a CVD method and a plasma enhanced CVD method.

Figure 2B:
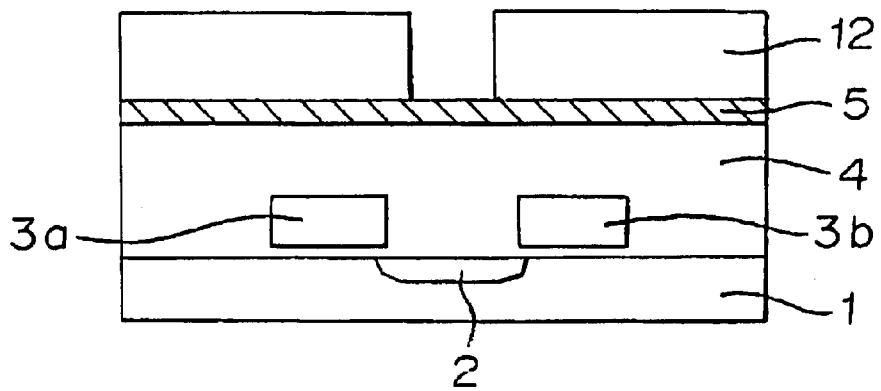
FIG. 2b is a cross-sectional view of the semiconductor device in a step of producing this according to Embodiment 1 of the present invention.

In FIG. 2b, a resist film having a predetermined contact pattern is formed on the first anti-reflection coating by a photo-lithography method. Since the first anti-reflection coating 5 prevents an exposure light from reflecting, dimensional controllability is improved and the resist film 12 having a good shape is obtainable with a high dimensional accuracy.

Figure 2C:
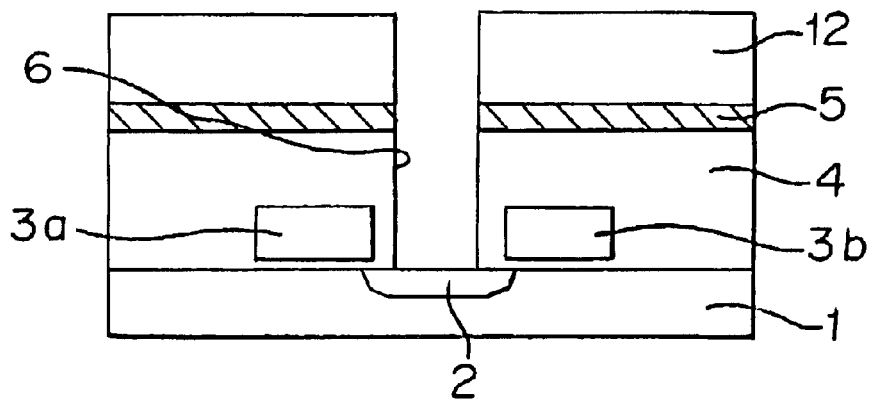
FIG. 2c is a cross-sectional view of the semiconductor device in a step of producing this according to Embodiment 1 of the present invention.

In FIG. 2c, the anti-reflection coating 5 and the first insulating film 4 are sequentially etched using the resist film 12 as an etching mask, and the first contact hole 6 penetrating between the gate electrodes 3a, 3b and reaching the source drain area of the semiconductor substrate 1.

The first anti-reflection coating 5 is etched under a condition of a pressure of 40 mT by a dry etching method using a mixed gas of $CH_2F_2$, $O_2$, and Ar, of which gas flow rates are respectively 20, 10, and 800 sccm. In a similar manner, the first insulating film 4 is etched under a condition of a pressure of 40 mT using a mixed gas of $C_4F_8$, CO, and Ar, of which gas flow rates are respectively 10, 10, and 150 sccm. These etchings are conducted by a two-step etching methods, in which etching conditions are sequentially switched over in a single chamber. After etching the first contact hole 6, the resist film 12 is removed.

In FIG. 3a, a metallic film 7a, made of polysilicon having a thickness of 200 nm, is deposited on the first anti-reflection coating 5 so as to fill in the first contact hole 6.

In FIG. 3b, the metallic film 7a is etched under a condition of a pressure of 40 mT using a mixed gas of $SF_6$, $Cl_2$, and Ar, of which gas flow rates are respectively 10, 10, and 150 sccm until a surface of the first anti-reflection coating 5 is exposed. Thus the first conductive plug 7, embedded in the first contact hole 6, is formed. The metallic film 7a may be removed by polishing in use of a Chemical Mechanical Polishing (CMP) method instead of the etching.

In FIG. 3c, the second insulating film 80, made of BPTEOS having a thickness of 1000 nm, is formed on the first anti-reflection coating 5 and the first conductive plug 7 using a CVD method. Thereafter, the resist film 12 having a predetermined contact pattern is formed.

Figure 4A:
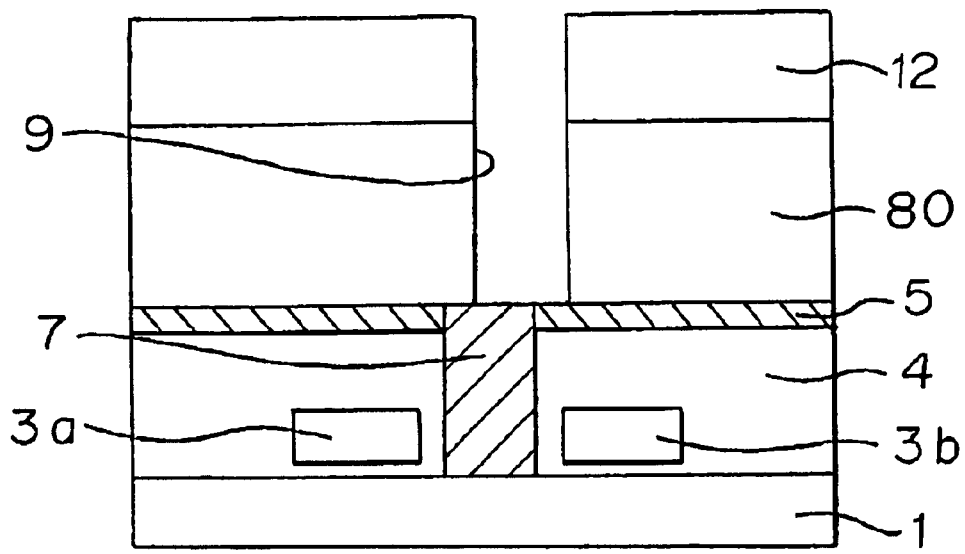
FIG. 4a is a cross-sectional view of the semiconductor device in a step of producing this according to Embodiment 1 of the present invention.

In FIG. 4a, the second insulating layer 80 is etched under a pressure of 40 mT of a mixed gas of $C_4F_8$, CO, Ar, of which gas flow rates are respectively 10, 10, 150 sccm, using the resist film 12 as an etching mask, whereby the second contact hole 9 reaching the first conductive plug 7 is formed.

Although there is a case that the second contact hole 9 is partly formed above the first insulating film 4 by deviating from the first conductive plug 7 by misregistration of the resist film 12, because the first anti-reflection coating 5 prevents the first insulating film 4, being a same type as the first insulating layer 80, from being etched as an etching prevention film, the first insulating film 4 is not etched, and the second contact hole 9 does not reach the electrode layers 3a or 3b by penetrating the first insulating film 4.

The first anti-reflection coating 5 may be appropriately designed so as to have functions as an anti-reflection coating and an etching prevention film in this step by changing various conditions such as a material and the film thickness thereof, an etching condition corresponding to the various conditions, and so on. Preferably, the material is a silicon oxynitride film.

Figure 4B:
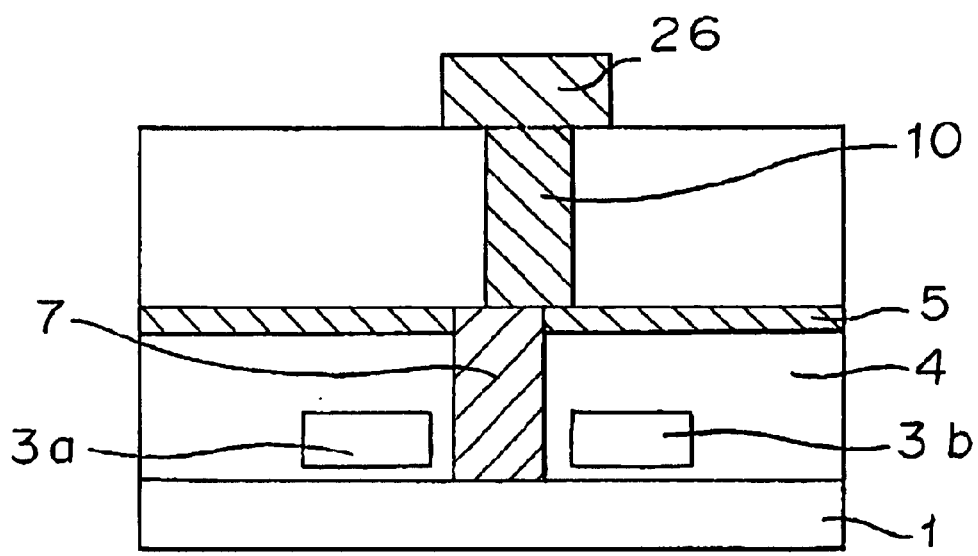
FIG. 4b is a cross-sectional view of the semiconductor device in a step of producing this according to Embodiment 1 of the present invention.

In FIG. 4b, the second conductive plug 10 is formed after processing steps similar to those illustrated in FIGS. 3a and 3b. Thereafter, the wiring layer 26, made of an aluminum alloy, is formed to electrically connecting to the source drain area 2 through the first conductive plug 7 and the second conductive plug 10.

Figure 5A:
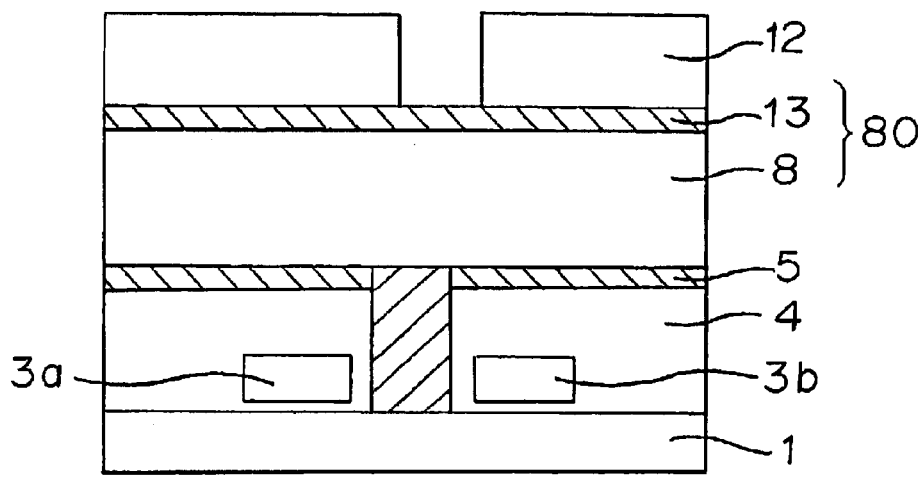
FIG. 5a is a cross-sectional view of the semiconductor device in a step of producing this according to Embodiment 1 of the present invention.

Although, in the above case, the resist film 12 served as the etching mask at time of forming the second contact hole 9 is directly formed on the second insulating layer 80 of the BPTEOS film, the second insulating layer 80 may be formed by a second insulating film 8 and a second anti-reflection coating 13 formed thereon, and the second insulating film 80 may be formed on the second anti-reflection film 13 in a similar manner to that the step of forming the first contact hole 6, as illustrated in FIG. 5a. In this case, it is possible to obtain the resist film 12 having a further high accuracy and a better shape.

Figure 5B:
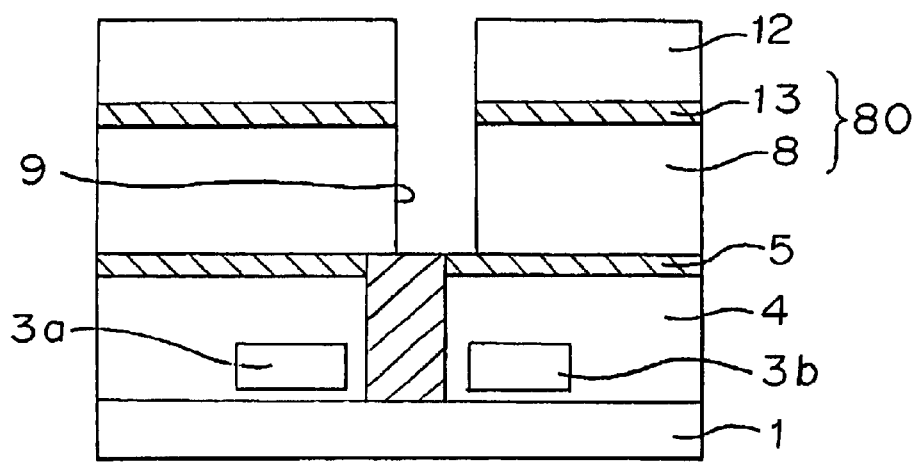
FIG. 5b is a cross-sectional view of a semiconductor device in a step of producing this according to Embodiment 1 of the present invention.
Figure 5C:
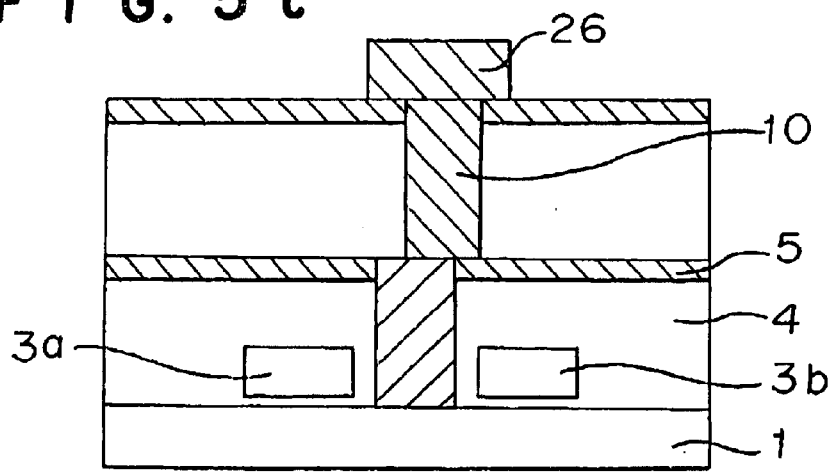
FIG. 5c is a cross-sectional view of the semiconductor device in a step of producing this according to Embodiment 1 of the present invention.

As illustrated in FIG. 5b, the second anti-reflection coating 13 and the second insulating film 8 are sequentially etched using the resist film 12 as an etching mask to form the second contact hole 9 reaching the first conductive plug 7 and the first anti-reflection coating 5. In FIG. 5c, after forming the second conductive plug 10 in the second contact hole 9, the wiring layer 26 is formed thereon. In this case, it is possible to obtain the second contact hole having a high accuracy and a good shape, whereby the second conductive plug 10 having a good shape is obtained, and an electrical connection between the second conductive plug 10 and the first conductive plug 7 becomes further stable.

As described, according to Embodiment 1 of the present invention, the first contact hole is formed using the resist film having a high accuracy and a good shape, formed on the first anti-reflection coating, as the mask, and the first anti-reflection coating functions as the etching prevention film or the first insulating film at time of forming the second contact hole to prevent the second contact hole from reaching the electrode layer, whereby a stable connection between the conductive plugs is obtained, and it is possible to obtain the semiconductor device having a contact structure with high reliability, in which the first conductive plug and the electrode layer are not shorted, is obtainable.

Embodiment 2

A semiconductor device and a method of producing this according to Embodiment 2 of the present invention will be described. In a similar manner to Embodiment 1, a contact structure including multi-layer conductive plugs, in which structure an anti-reflection coating used at time of forming a resist film is further used as an etching prevention film, is applied to a capacitor.

Figure 6:
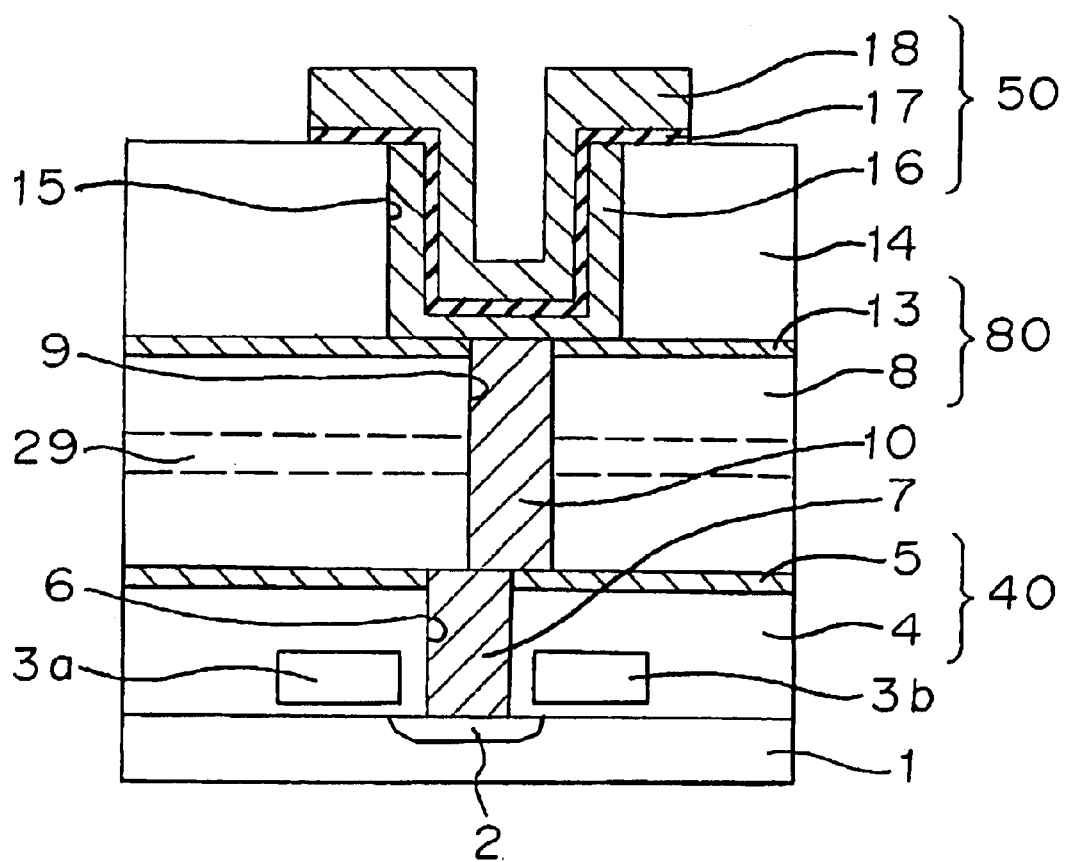
FIG. 6 is a cross-sectional view of a semiconductor device according to Embodiment 2 of the present invention.

FIG. 6 is a cross-sectional view of the semiconductor device having the capacitor according to Embodiment 2 of the present invention. Numerical references same as those described in Embodiment 1 designate same or similar portions, and description of these portions is omitted.

In FIG. 6, numerical reference 14 designates a third insulating film; numerical reference 15 designates an opening formed in the third insulating film 14 and reaching a second conductive plug 10; numerical reference 29 designates an electrode layer such as a bit wire formed in a second insulating film 8; and numerical reference 50 designates a capacitor fabricated by a storage node electrode 16 formed in the opening 15, a capacitor dielectric film 17 extending and formed on the third insulating film 14, and a cell plate electrode 18 formed on the capacitor dielectric film 17.

In the semiconductor device, the capacitor 50 and a source drain area 2 are electrically connected through a contact structure formed by connecting a conductive plug 7 and a conductive plug 10, wherein the conductive plug 7 and the conductive plug 10 are respectively formed in the first insulating layer 40 including the anti-reflection coating and the second insulating layer 80.

A method of producing the semiconductor device illustrated in FIG. 6 will be described in reference of a cross-sectional view of the semiconductor device in a step of producing this illustrated in FIGS. 7a and 7b.

After obtaining a structure illustrated in FIG. 5b in steps similar to those described in Embodiment 1, the second conductive plug 10 is formed in a second contact hole 9.

Figure 7A:
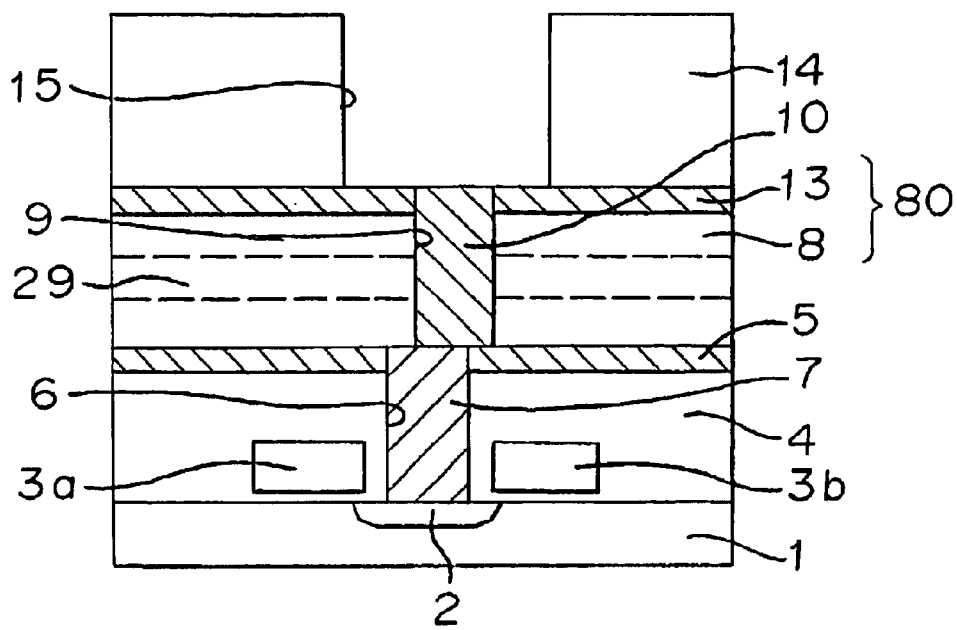
FIG. 7a is a cross-sectional view of a semiconductor device in a step of producing this according to Embodiment 2 of the present invention.

In FIG. 7a, the third insulating film 14, made of BPTEOS having a thickness of 1000 nm, is formed on the second conductive plug 10 and the second anti-reflection coating 13 by a CVD method. The third insulating film 14 is etched under a pressure of 40 mT of a mixed gas of $C_4F_8$, CO, and Ar, of which flow rates are respectively 10, 10, and 150 sccm using a resist film (not shown) having an opening pattern as an etching mask to thereby form the opening 15 reaching the second conductive plug 10 and a second anti-reflection coating 13.

In the second insulating film 8, a bit wire 29 designated by dotted lines is formed in left and right directions of FIG. 7a. The second conductive plug 10 is formed in a vicinity of a side surface of the bit wire 29. However, in such a case, the second anti-reflection coating 13 prevents the first insulating film 8 from being etched at time of forming the opening 15 by etching. Therefore, the opening 15 does not penetrate the second insulating film 8 to reach the bit wire 29.

Figure 7B:
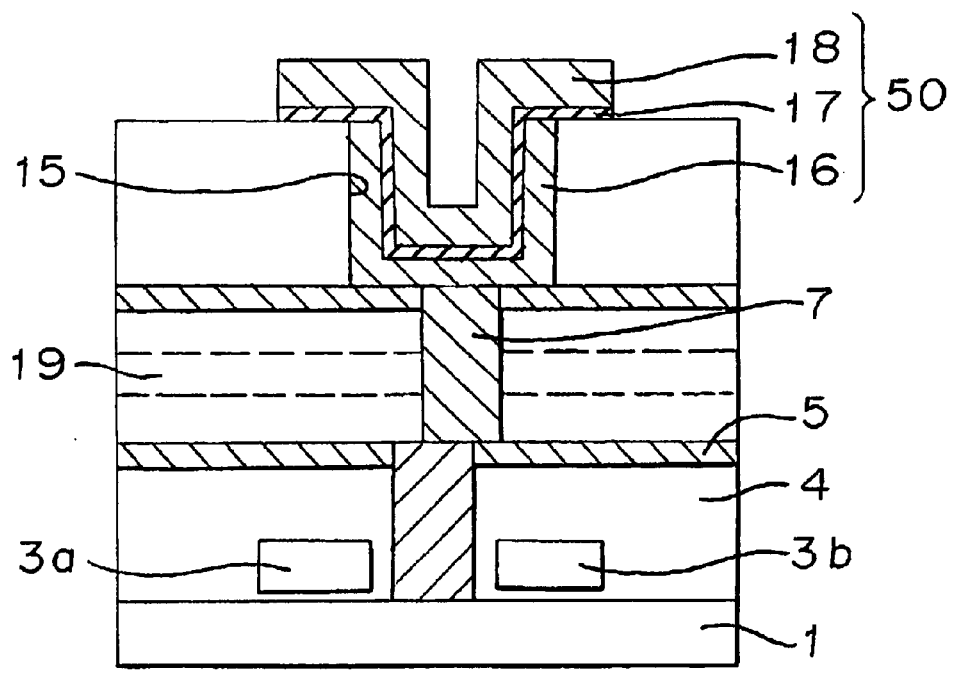
FIG. 7b is a cross-sectional view of the semiconductor device in a step of producing this according to Embodiment 2 of the present invention.

In FIG. 7b, the storage node electrode 16 made of polysilicon is formed in the opening 15, and the capacitor dielectric film 17, made of a nitride film and extending on the third insulating film 14, and the cell plate electrode 18 are sequentially formed thereon, whereby a capacitor 50 is formed.

As described, according to Embodiment 2 of the present invention, the first and second contact holes are formed by etching using resist films, respectively formed on the first and second anti-reflection coatings, as masks, and the resist films function as an etching prevention film at time of forming to etch the second contact hole and the opening. Therefore, the second contact hole and the opening do not reach an electrode layer, whereby it is possible to obtain the semiconductor device having the capacitor with a highly reliable contact structure, in which a stable connection between conductive plugs is obtainable and the second conductive plug and a capacitor electrode are not shorted with the electrode layer.

Embodiment 3

A semiconductor device and a method of producing this according to Embodiment 3 of the present invention will be described. In Embodiment 3, the present invention is applied to a two-layer wiring structure using a conductive plug.

Figure 8:
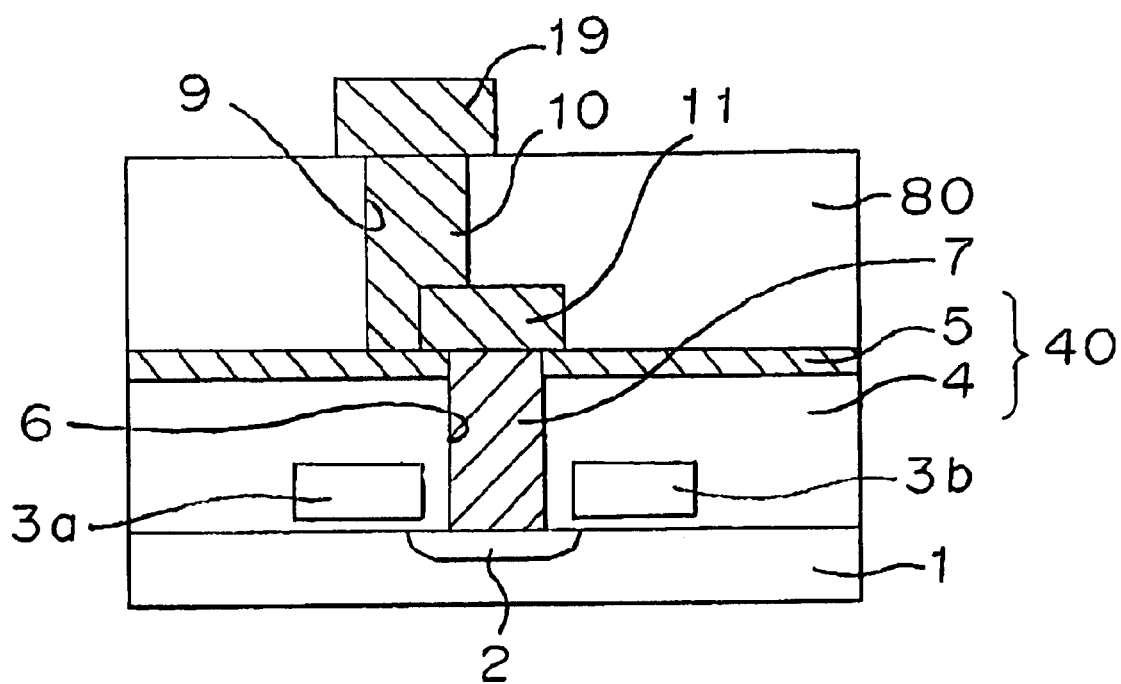
FIG. 8 is a cross-sectional view of a semiconductor device according to Embodiment 3 of the present invention.

FIG. 8 is a cross-sectional view of the semiconductor device according to Embodiment 3. The same numerical references are used for same or similar portions to those in Embodiments 1 and 2, and description of these portions are omitted.

In FIG. 8, numerical reference 11 designates a first wiring layer formed on a first conductive plug 7 and numerical reference 19 designates a second wiring layer formed on a second conductive plug 10.

The semiconductor device has the two-layer wiring structure including the first wiring layer 11 electrically connected to a source drain area on a semiconductor substrate through the first conductive plug 7, which is formed in a first contact hole 6 in a first insulating layer 40 including an anti-reflection coating 5, and the second wiring layer 19 electrically connected to the first wiring layer 11 on the first wiring layer 11 through the second conductive plug 11 formed in a second contact hole 9 in a second insulating layer 80.

The method of producing the semiconductor device illustrated in FIG. 8 will be described in reference of cross-sectional views of steps of producing the semiconductor device of FIGS. 9a through 10b.

Figure 9A:
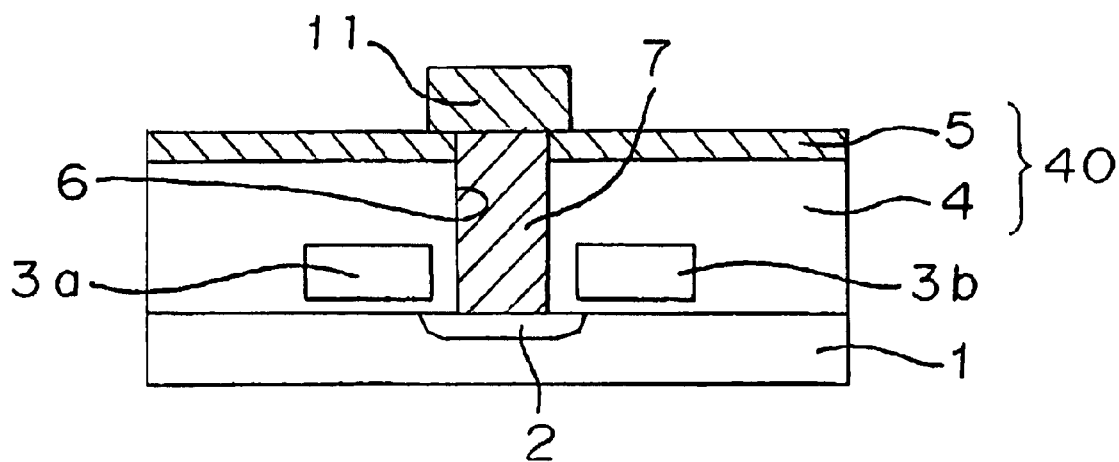
FIG. 9a is a cross-sectional view of a semiconductor device in a step of producing this according to Embodiment 3 of the present invention.

At first, a structure illustrated in FIG. 3b is obtained after processing steps similar to those described in Embodiment 1. In FIG. 9a, the first wiring layer 11 made of an aluminum alloy, which is connected to the source drain area in through the conductive plug 7, is formed on the first conductive plug 7.

Figure 9B:
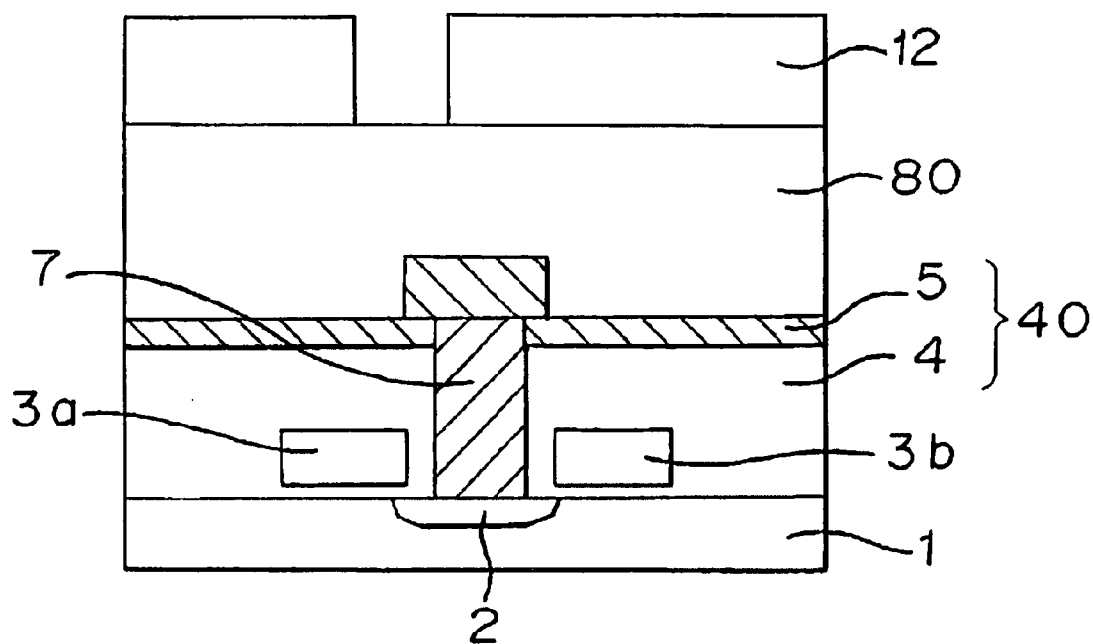
FIG. 9b is a cross-sectional view of the semiconductor device in a step of producing this according to Embodiment 3 of the present invention.

In FIG. 9b, the second insulating layer 80 is formed on the first conductive plug 7 and the first anti-reflection coating 5. A resist film 12 having a predetermined contact pattern is formed thereon.

Figure 10A:
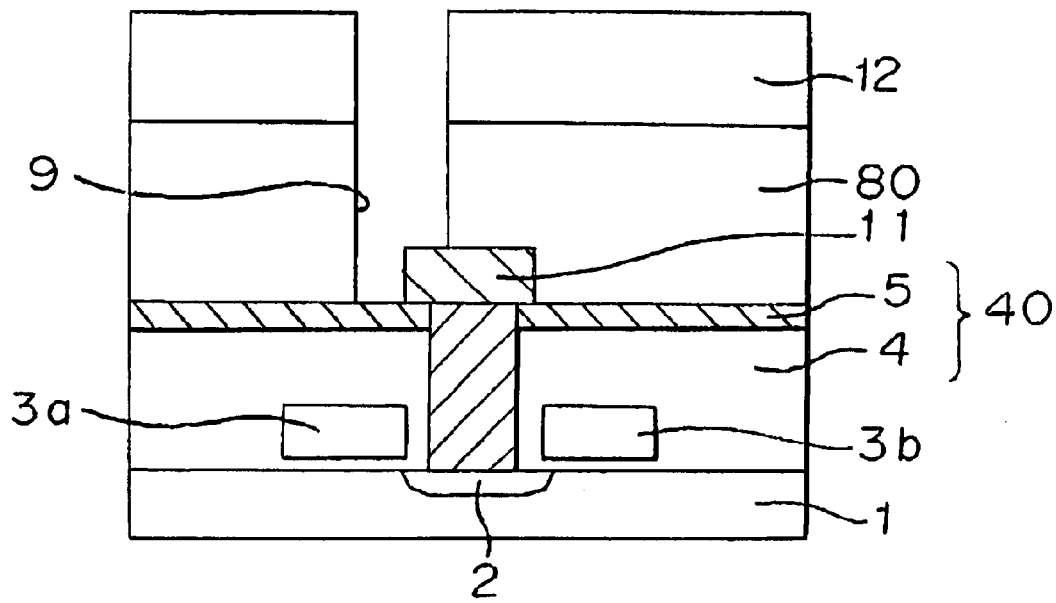
FIG. 10a is a cross-sectional view of the semiconductor device in a step of producing this according to Embodiment 3 of the present invention.

In FIG. 10a, the second insulating layer 80 is etched using the resist film 12 as an etching mask to form the second contact hole 9 reaching the first conductive plug 7.

Figure 10B:
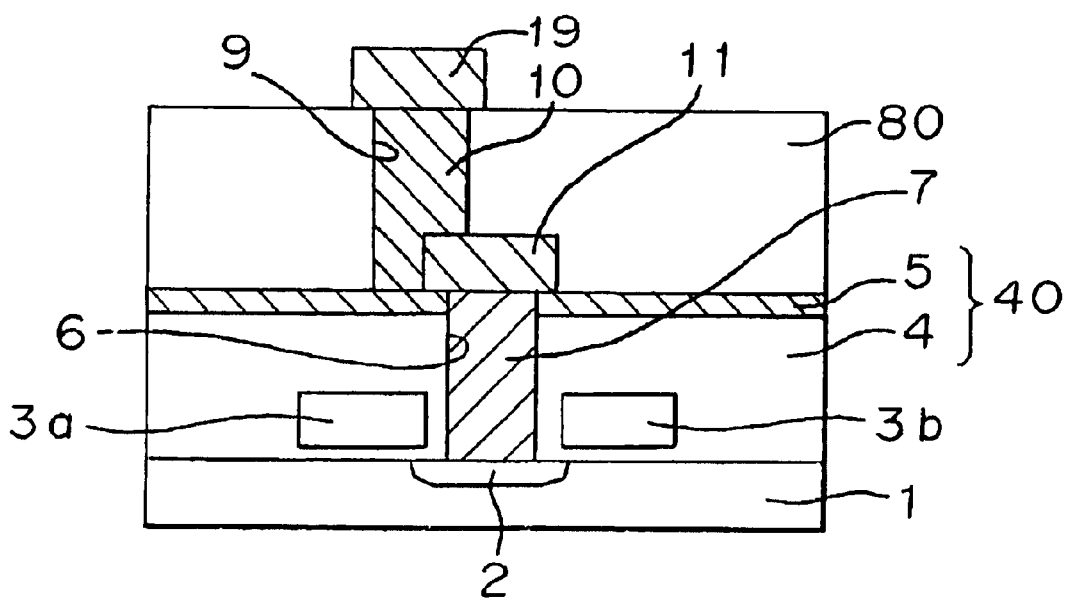
FIG. 10b is a cross-sectional view of the according to Embodiment 3 of the present invention.

Although there is a case that the second contact hole is partly formed above a first insulating film 4 when the second contact hole 9 is deviated from the first wiring layer 11 by misregistration of the resist film 12, because the anti-reflection coating 5 prevents a first insulating film 4, which is a similar type to the first insulating layer, from being etched as an etching prevention film, a first contact hole 6 does not reach gate electrodes 3a, 3b by penetrating the first insulating film 4. In FIG. 10b, a second conductive plug is formed in the second contact hole 9, and the second wiring layer 19, made of an aluminum alloy and electrically connected to the first wiring layer 11 through the second conductive plug 10, is formed thereon.

Figure 11A:
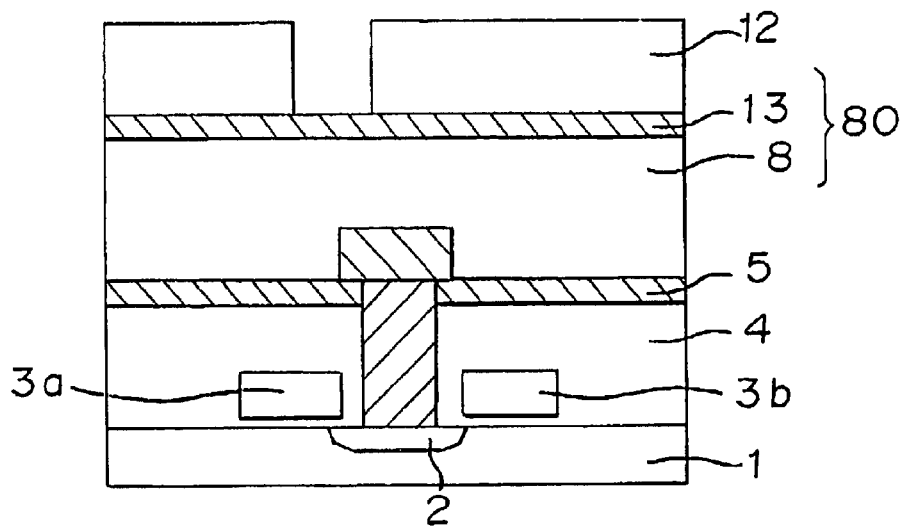
FIG. 11a is a cross-sectional view of a semiconductor device in a step of producing this according to Embodiment 3 of the present invention.
Figure 11B:
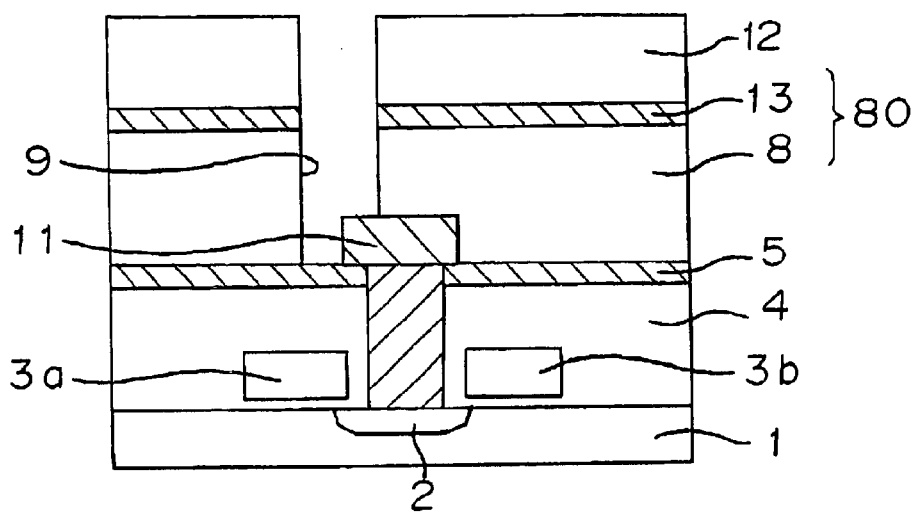
FIG. 11b is a cross-sectional view of the semiconductor device in a step of producing this according to Embodiment 3 of the present invention.

Although in the above case, the second insulating layer 80 does not include an anti-reflection coating, the second insulating layer 80 may be formed by a first insulating film 8 and a second anti-reflection coating 13 formed thereon as illustrated in FIG. 11a. In this case, it is possible to obtain the resist film 12 having a further high dimensional accuracy and a further good shape by an effect of preventing a reflection of the second anti-reflection coating 13.

Figure 11C:
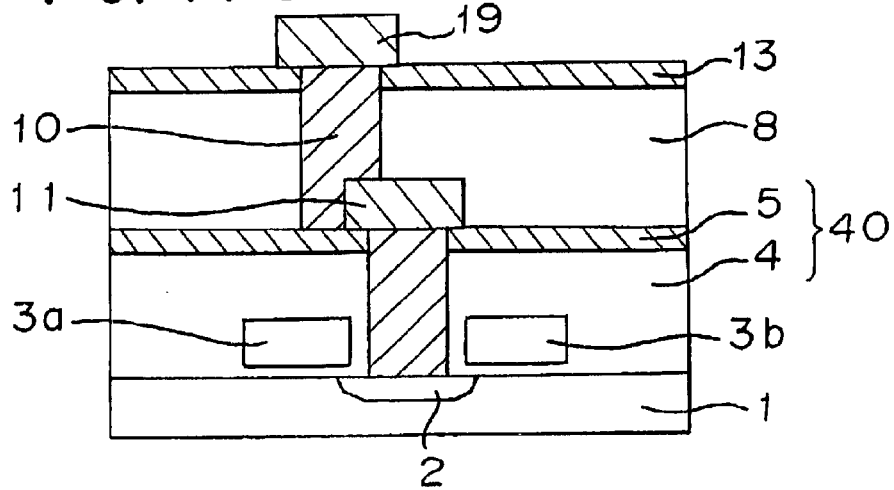
FIG. 11c is a cross-sectional view of the semiconductor device in a step of producing this according to Embodiment 3 of the present invention.

As illustrated in FIG. 11a, it is possible to obtain the second contact hole 9 having a high dimensional accuracy and a good shape by etching the second insulating layer 80 using the resist film 12 as an etching mask. Further as illustrated in FIG. 11c, after embedding the second conductive plug 10 in the second conductive plug 9, the second wiring layer 19 is formed thereon. Therefore, it is possible to obtain a stable electrical connection between the second conductive plug 10 and the first wiring layer 11.

As described, according to Embodiment 3 of the present invention, the first contact hole is formed using the resist film with a high dimensional accuracy, which is formed on the first anti-reflection coating, as the mask, and the first anti-reflection coating functions as the etching prevention film with respect to the first insulating film at time of forming the second contact hole to prevent the second contact hole from reaching an electrode layer. Therefore, it is possible to obtain the semiconductor device having the multi-layer wiring structure with high reliability, in which an electrical connection between the conductive plug and the wiring layer is stable and the second conductive plug and the electrode layer are not shorted.

Embodiment 4

A semiconductor device and a method of producing the semiconductor device according to Embodiment 4 of the present invention will be described. In Embodiment 4, the two-layer wiring structure in Embodiment 2 is modified to a three-layer wiring structure. FIG. 12 is a cross-sectional view of the semiconductor device having the three-layer wiring structure according to Embodiment 4. The same numerical references as those used in Embodiment 1 through 3 designate same or similar portions, and description of these portions is omitted.

In FIG. 12, numerical reference 20 designates a third insulating film; numerical reference 21 designates a third contact hole; numerical reference 22 designates a third conductive plug; and numerical reference 23 designates a third wiring layer.

Hereinbelow, the method of producing the semiconductor device illustrated in FIG. 12 will be described in reference of cross-sectional views of steps of producing this illustrated in FIGS. 13a and 13b. The structure illustrated in FIG. 11c in Embodiment 3 is formed in similar steps to those in Embodiment 3.

Figure 13A:
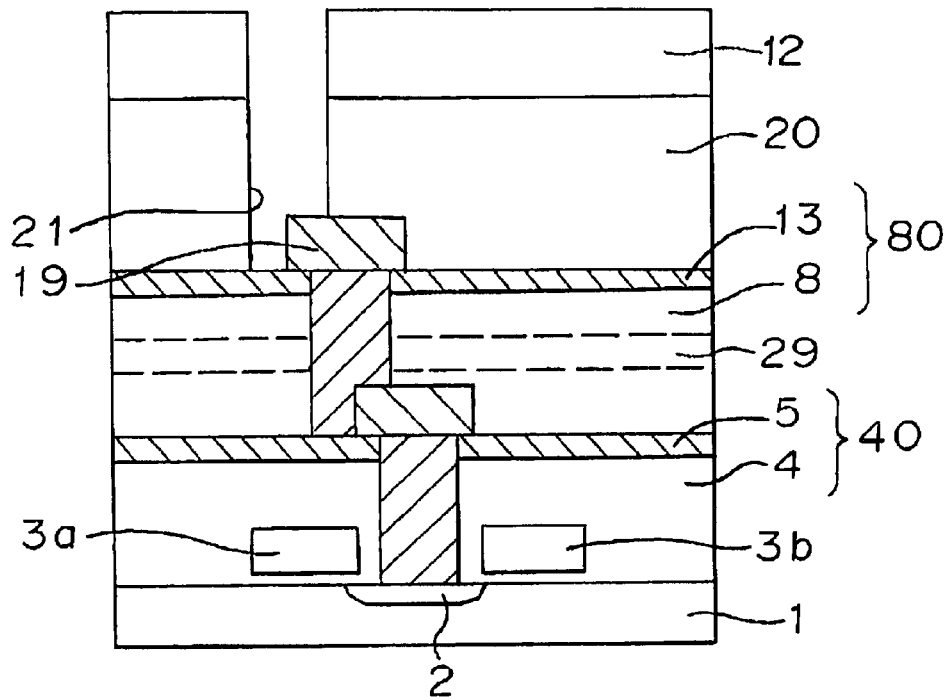
FIG. 13a is a cross-sectional view of a semiconductor device in a step of producing this according to Embodiment 4 of the present invention.

In FIG. 13a, the third insulating film 20, made of BPTEOS having a thickness of 1000 nm, is formed on a second wiring layer 19 and a second anti-reflection coating 13 by a CVD method. Thereafter, the third insulating film 20 is etched under a pressure of 40 mT of a mixed gas of $C_4F_8$, CO, and Ar, of which the flow rates are respectively 10, 10, and 150 sccm using a resist film 12 having a contact pattern as an etching mask to form the third contact hole 21 reaching the second wiring layer 19.

At this time, there is a case that the third contact hole 21 is partly formed above a second insulating film 8 by deviating from the second wiring layer 19 by misregistration of the resist film 12. However, in such a case, because the second anti-reflection coating 13 prevents the second insulating film 8, which is the same type as the third insulating film 20, from being etched as an etching prevention film, the third contact hole 21 does not reach a bit wire 29 formed in a vicinity of a second contact hole in the second insulating film 8 by penetrating the second insulating film 8.

Figure 13B:
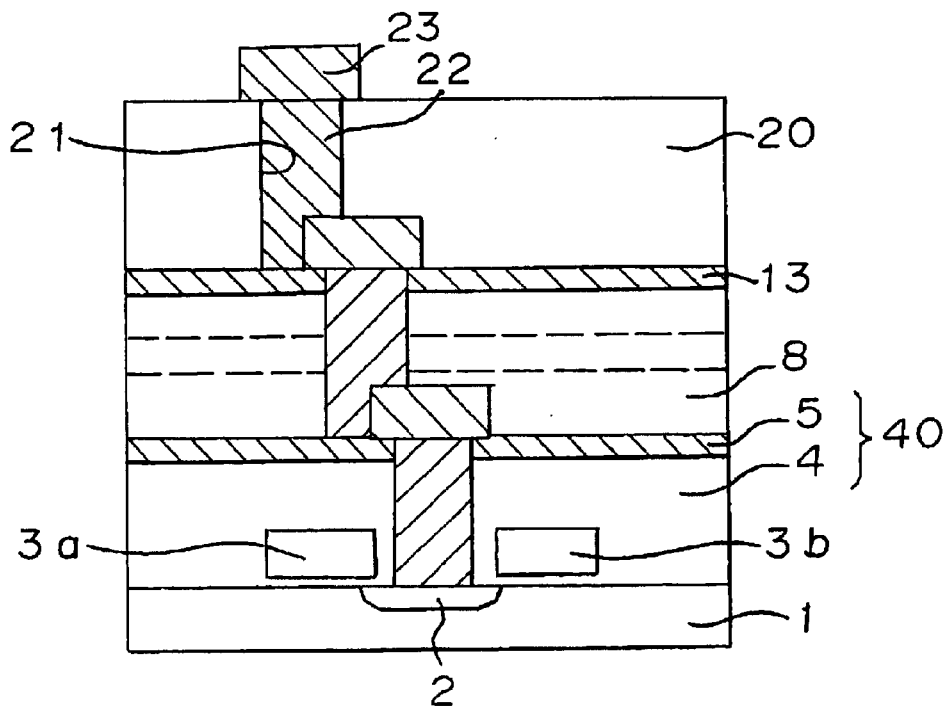
FIG. 13b is a cross-sectional view of the semiconductor device in a step of producing this according to Embodiment 4 of the present invention.

In FIG. 13b, the third conductive plug 22, made of polysilicon, is formed in the third contact hole 21, and the third wiring layer, made of an aluminum alloy and connected to the second wiring layer 19 through the third conductive plug 22, is formed thereon.

Although, in the above case, the three layer wiring structure is exemplified, it is possible to obtain a multi-layer wiring structure using a method similar thereto.

As described, according to Embodiment 4 of the present invention, the first contact hole and the second contact hole are respectively formed using the resist films having a high dimensional accuracy, which is respectively formed on the first anti-reflection coating and the second anti-reflection coating, as the masks; and the second and third contact holes do not reach an electrode layer since the anti-reflection coatings function as the etching prevention films at time of forming the second and third contact holes. Therefore, it is possible to obtain the semiconductor device having a multi-layer wiring structure with high reliability, in which an electrical connection between the conductive plug and the wire is stable, and the second and third conductive plug are not shorted with the electrode layer.

Embodiment 5

In Embodiment 5, the present invention is applied to a semiconductor device having a wiring structure, in which conductive plugs are connected via an etching prevention film to form a multi-layer.

Figure 14:
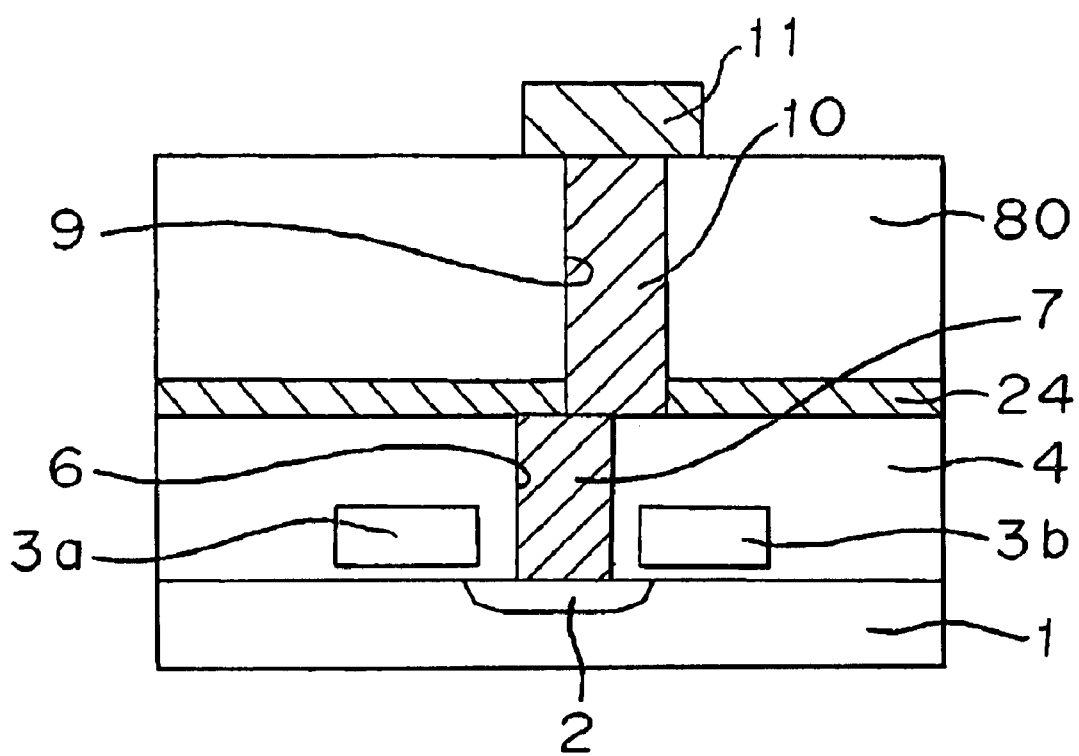
FIG. 14 is a cross-sectional view of a semiconductor device according to Embodiment 5 of the present invention.

FIG. 14 is a cross-sectional view of the semiconductor device produced according to a method of producing the semiconductor device according to Embodiment 5. Numerical reference 24 designates a first etching prevention film. Other numerical references designate portion the same as or similar to those described in Embodiment 1 through 4.

Hereinbelow, the semiconductor device will be described in reference of cross-sectional views illustrated in FIGS. 15a through 17b.

Figure 15A:
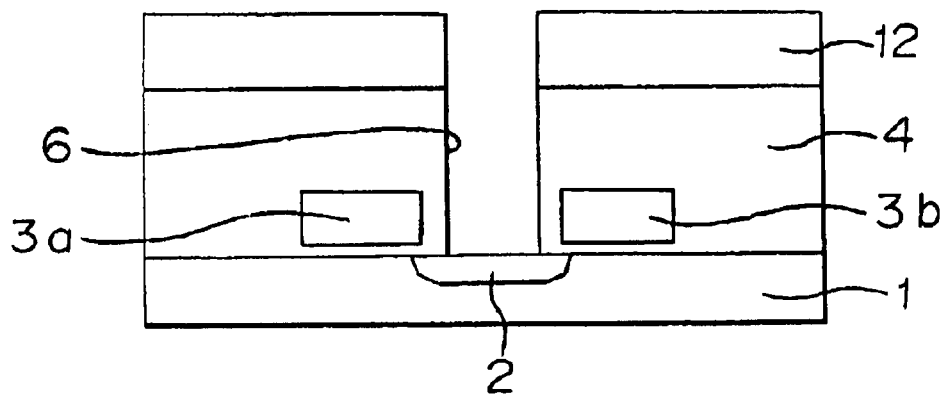
FIG. 15a is a cross-sectional view of a semiconductor device in a step of producing this according to Embodiment 5 of the present invention.

In FIG. 15a, electrode layers 3a, 3b disposed so as to interpose a source drain area 2, which is formed on a semiconductor substrate 1, are formed as a semiconductor layer. A first insulating film 4, made of BPTEOS having a thickness of 600 nm, is formed on the semiconductor substrate 1 and the electrode layers 3a, 3b. A first contact hole 6 reaching the source drain area 2 by tunneling between the electrode layers 3a, 3b, is formed using a resist film 12 having a predetermined contact pattern, which is formed on the first insulating film 4, as an etching mask. After forming the first contact hole 6, the resist film 12 is removed.

Figure 15B:
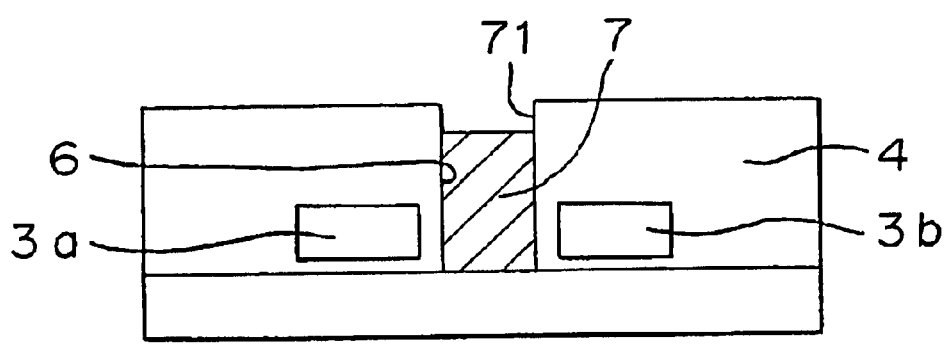
FIG. 15b is a cross-sectional view of the semiconductor device in a step of producing this according to Embodiment 5 of the present invention.

In FIG. 15b, after depositing a polysilicon film so as to embed the first contact hole 6 in the first insulating film 4, surfaces of the first insulating film 4 and the polysilicon film are etched or abraded to form a first conductive plug embedded in the first contact hole 6.

At this time, when evenness of a film thickness of the deposited polysilicon film, an etching speed of etching the polysilicon film, or uniformity of an abrading speed in a wafer surface is bad, it is necessary to over-etch or over-polish an entire surface of the wafer or removing the polysilicon film on the surface of the first insulating film 4. As a result, a large drop 71 of about 80 through 100 nm occurs in the surface of the first conductive plug 7. The invention according to Embodiment 5 is effective in such a case.

Figure 15C:
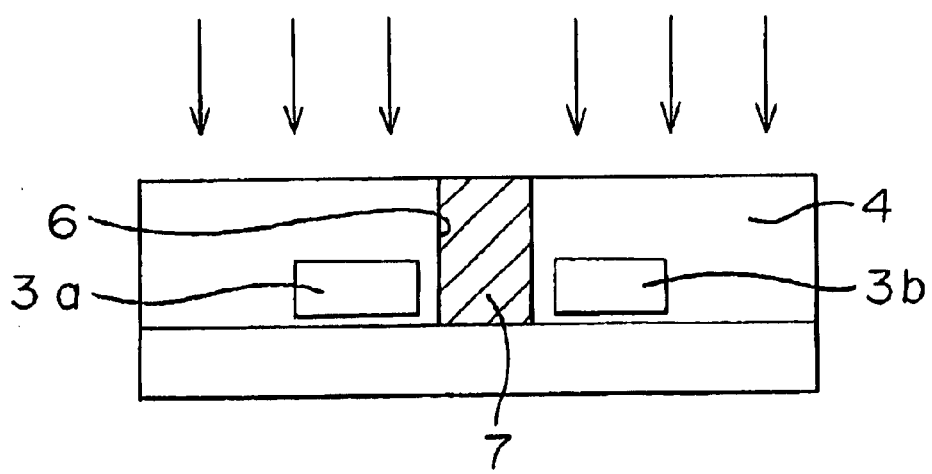
FIG. 15c is a cross-sectional view of the semiconductor device in a step of producing this according to Embodiment 5 of the present invention.

In FIG. 15c, the first insulating film 4 is etched or abraded under a pressure of 40 mT of a mixed gas of $CHF_3$, $CF_4$, and Ar, of which gas flow rates are respectively 30, 30, and 600 sccm, to flatten surfaces of the first insulating film 4 and the first conductive plug 7.

At this time, the film thickness of the first insulating film 4 is reduced by etching or abrading, it is preferable to previously set an initial film thickness of the first insulating film 4 to be thicker than the final film thickness as much.

Figure 16A:
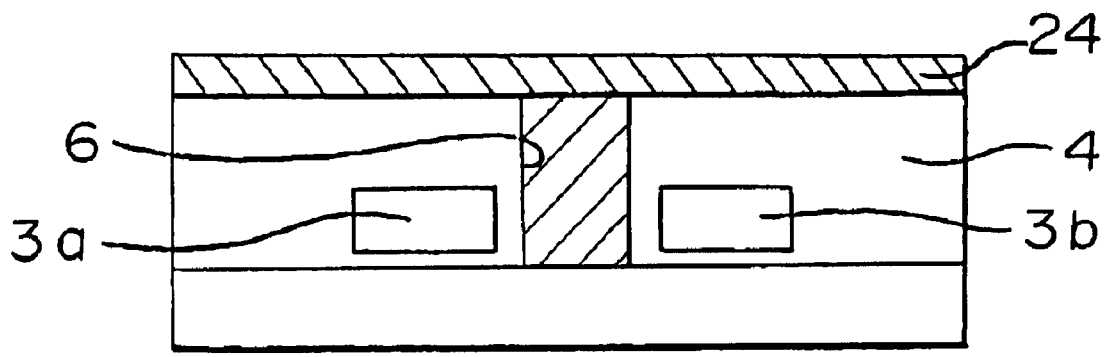
FIG. 16a is a cross-sectional view of the semiconductor device in a step of producing this according to Embodiment 5 of the present invention.

In FIG. 16a, the first etching prevention film 24, made of a silicon nitride film having a thickness of 30 nm, which silicon nitride film has high etch selectivity with respect to a second insulating film 8 described below, is formed on the first insulating film 4 and the first conductive plug 7 by a low-pressure CVD method. The first etching prevention film 24 has a flat surface without unevenness because it is formed on a flat surface, where the surfaces of the first insulating film 4 and the first conductive plug 7 are flat.

Figure 16B:
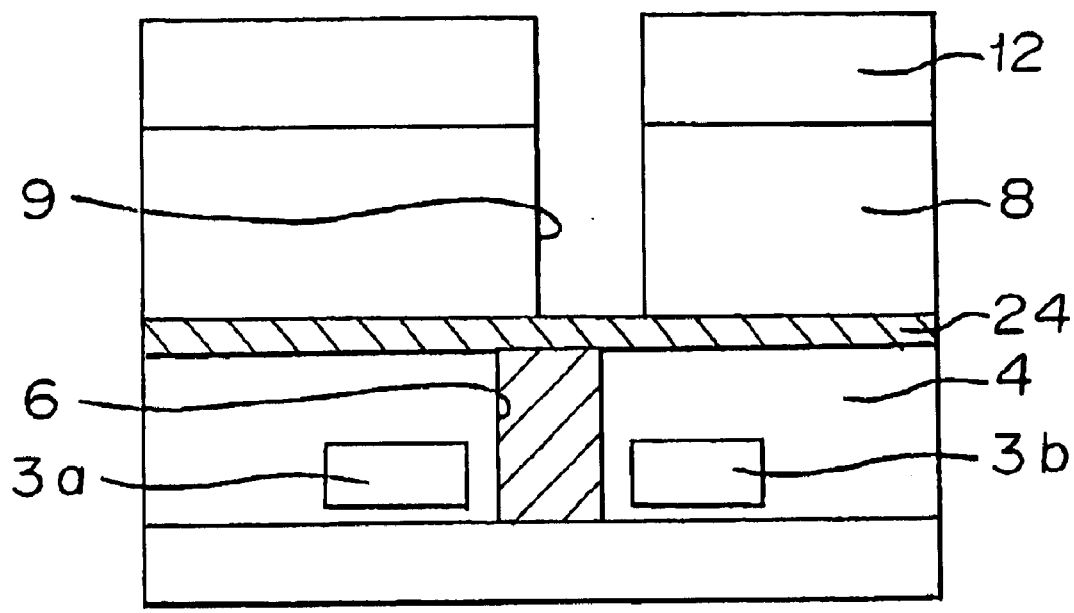
FIG. 16b is a cross-sectional view of the semiconductor device in a step of producing this according to Embodiment 5 of the present invention.

In FIG. 16b, the second insulating film 8, made of BPTEOS having a thickness of 1000 nm, is formed on the first etching prevention film 24. a second contact hole 9 is etched under a pressure of 40 mT of a mixed gas of $CHF_3$, $CF_4$, and Ar, of which gas flow rates are respectively 30, 30, 600 sccm, using a resist film 12 having a predetermined contact pattern, which is formed on the second insulating film 8, as an etching mask.

Because the first etching prevention film 24 has high etch selectivity with respect to the first insulating film 4, the second contact hole is stopped to be etched on a surface of the first etching prevention film 24. Accordingly, even though the second contact hole 9 is deviated from the first contact hole 6, the second contact hole 9 does not reach the electrode layer 3b by penetrating the first insulating film 4, which is the same type as the second insulating film 8.

Figure 17A:
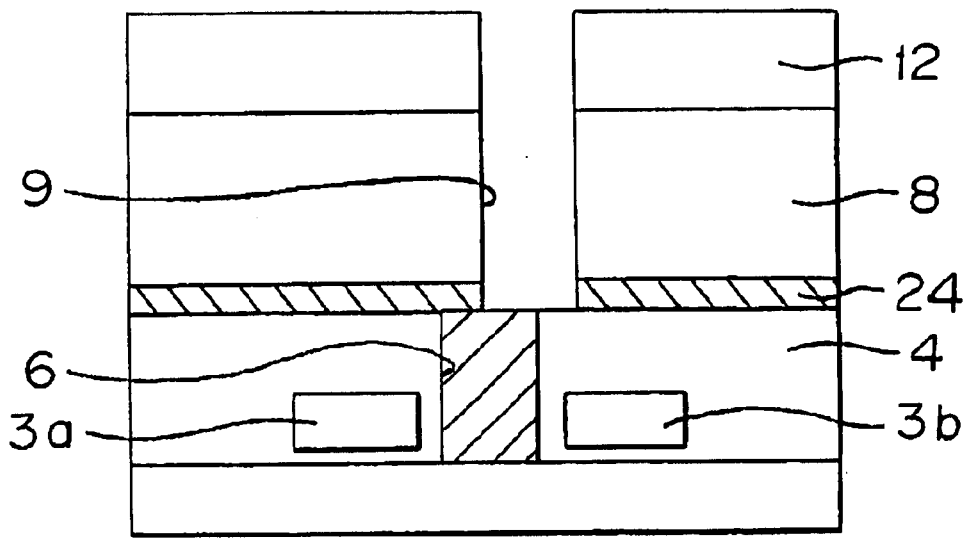
FIG. 17a is a cross-sectional view of the semiconductor device in a step of producing this according to Embodiment 5 of the present invention.

In FIG. 17a, succeeding to etching of the second contact hole 9, the first etching prevention film 24 exposed to a surface of the second contact hole 9 is etched under a pressure of 40 mT of a mixed gas of $CH_2F_2$, $O_2$, and Ar, of which gas flow rates are respectively 30, 30, 600 sccm, to connect the second contact hole 9 to the first conductive plug 7. Because a surface of the first etching prevention film 24 exposed to the surface of the second contact hole 9 is a flat surface as described, a part of the first etching prevention film 24 is not left on a surface of the first conductive plug 7 by this etching.

Further, because the first etching prevention film 24 is thin, it is possible to control the first insulating film 4 so as to be scarcely etched even though a part of the first insulating film 4 is exposed when the second contact hole 9 is deviated from the first conductive plug 7.

Figure 17B:
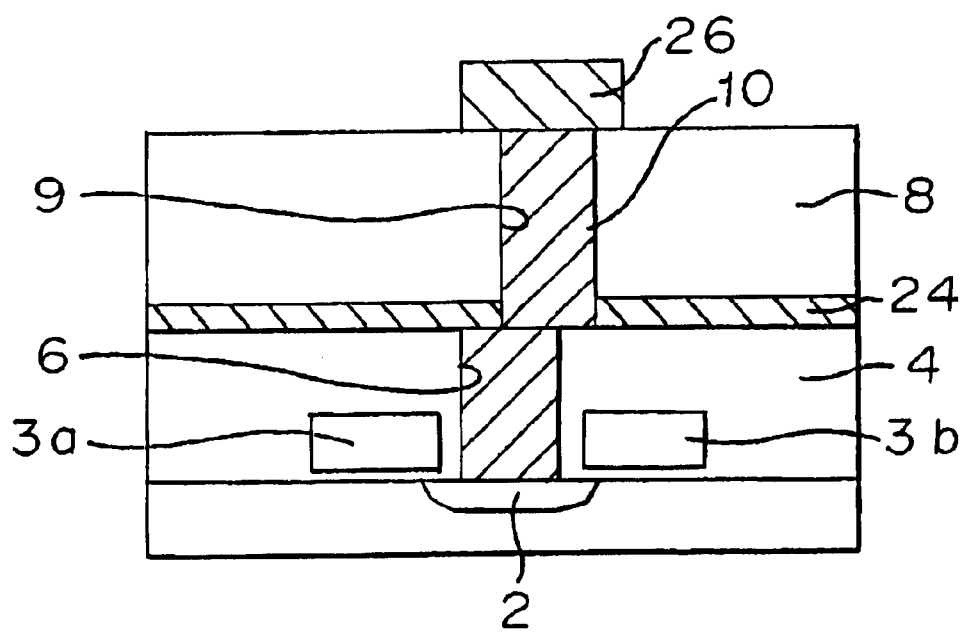
FIG. 17b is a cross-sectional view of the semiconductor device in a step of producing this according to Embodiment 5 of the present invention.

In FIG. 17b, a second conductive plug 10, made of polysilicon, is formed in the second contact hole 9 in a similar step to that illustrated in FIG. 15b, and a wiring layer 26 as a conductive layer made of an aluminum alloy is formed on the second conductive plug 10, wherein the wiring layer 26 is connected to the source drain area through the second conductive plug 10 and the first conductive plug 7.

As described, according to the Embodiment 5 of the present invention, since the first etching prevention film is formed on the flat surface without a drop of the conductive plug, even though the first etching prevention film is etched, it is not left as a residue between the first conductive plug and the second conductive plug. As a result, it is possible to suppress a contact resistance between the first and second conductive plugs, whereby a semiconductor device having a highly reliable contact structure is obtainable.

Embodiment 6

In Embodiment 6, a contact structure including a two-layer conductive plugs formed by interposing an etching prevention film is applied to a capacitor of DRAM as a semiconductor memory device. Embodiment 6 relates to a method of reducing a contact resistance between a capacitor electrode and the conductive plugs.

Figure 18:
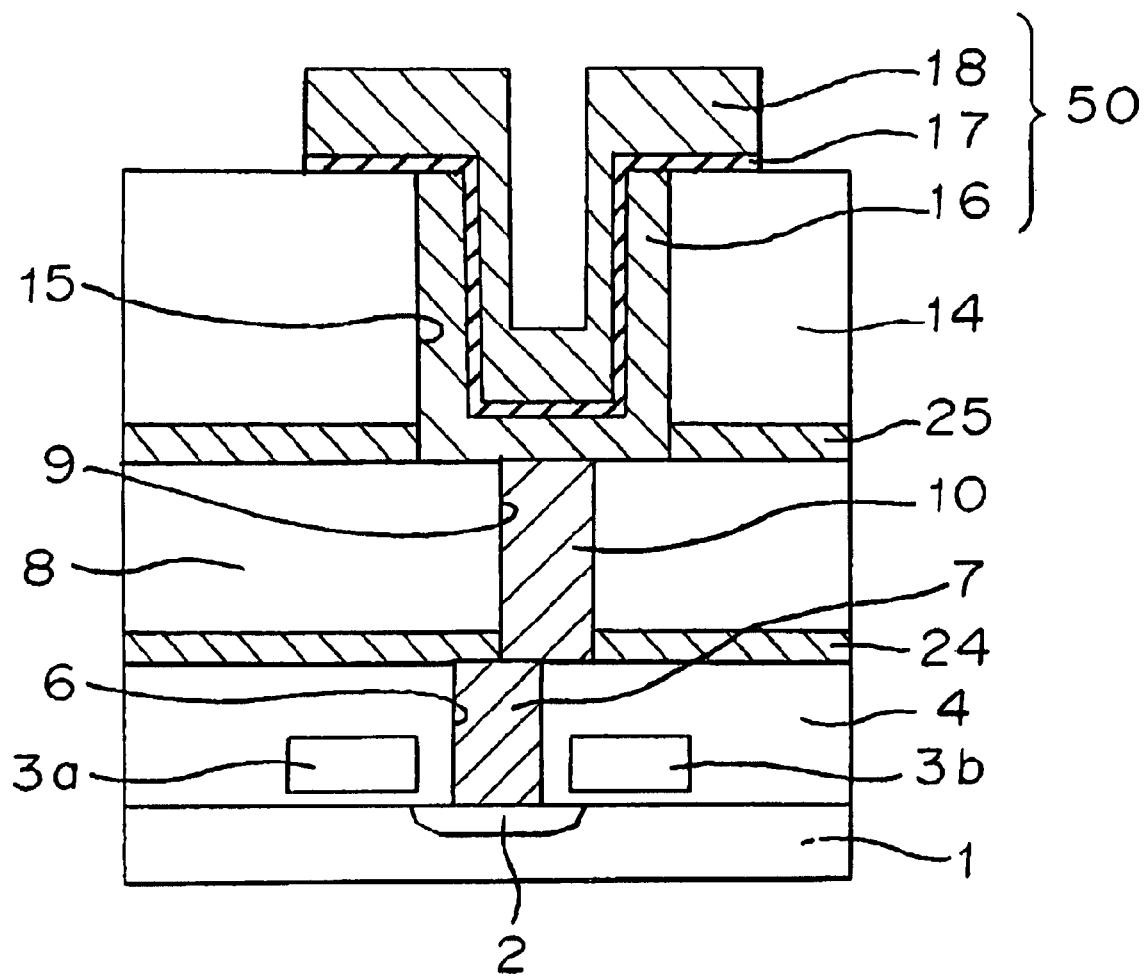
FIG. 18 is a cross-sectional view of a semiconductor device according to Embodiment 6 of the present invention.

FIG. 18 is a cross-sectional view of a capacitor of the semiconductor device produced by the method described in Embodiment 6. Numerical reference 25 designates a second etching prevention film. Other numerical references designate portions the same as or similar to the numerical references described in Embodiments 1 through 5. Hereinbelow, a method of producing the semiconductor device will be described in reference of cross-sectional views of steps of producing illustrated in FIGS. 19a through 21.

Figure 19A:
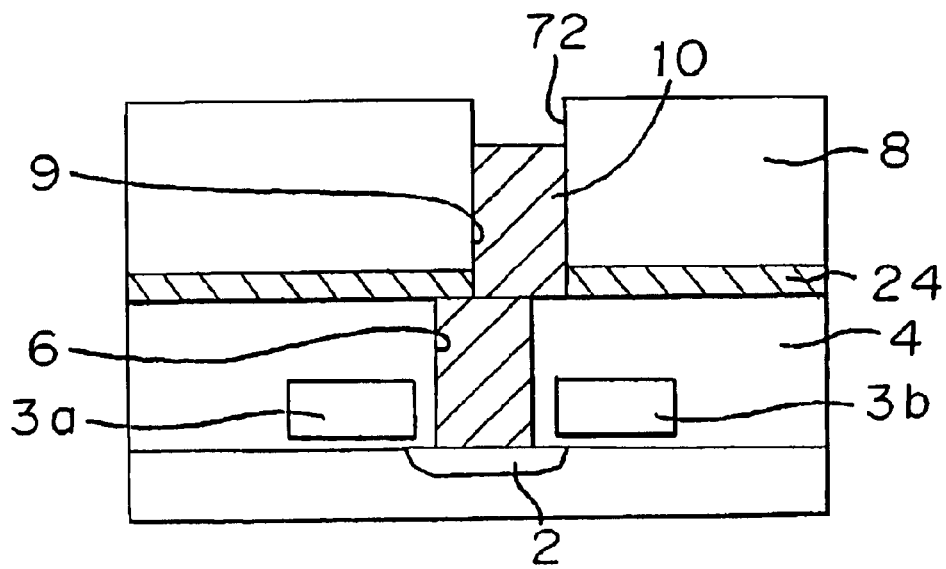
FIG. 19a is a cross-sectional view of a semiconductor device in a step of producing this according to Embodiment 6 of the present invention.

After processing steps similar to those described in Embodiment 5, a structure illustrated in FIG. 17a is obtained. In FIG. 19a, after removing a resist film 12, a second conductive plug 10 made of polysilicon is formed in a second contact hole 9. In case that a large drop 72 of about 80 through 100 nm is formed on a surface of a second conductive plug 10 by reasons similar to those described in the step illustrated in FIG. 15b of Embodiment 5 will be described.

Figure 19B:
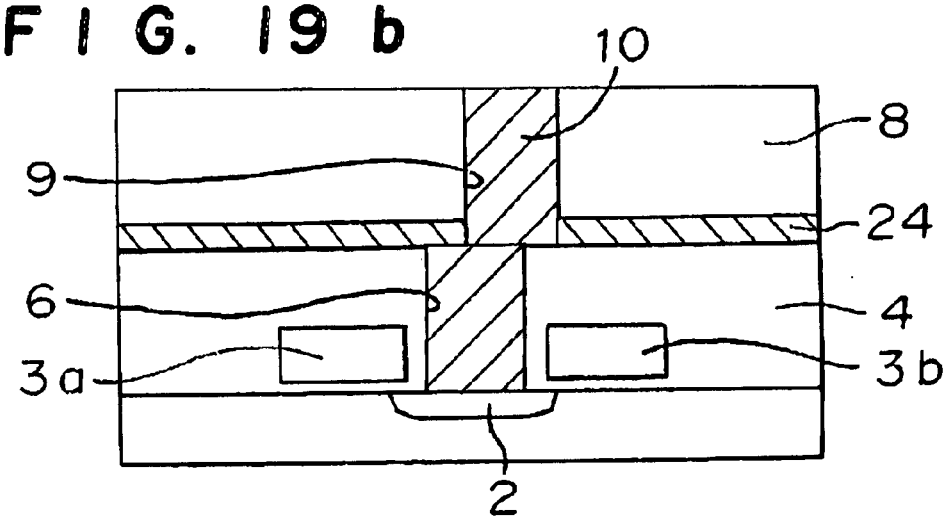
FIG. 19b is a cross-sectional view of the semiconductor device in a step of producing this according to Embodiment 6 of the present invention.

In FIG. 19b, a surface of a second insulating film 8 including the second conductive plug 10 is flattened to be arranged on a surface of the second conductive plug by etching or abrading under a pressure of 40 mT using a mixed gas of $CHF_3$, $CF_4$, and Ar, of which gas flow rates are respectively 30, 30, and 600 sccm.

Because the film thickness of the second insulating film 8 is reduced by an amount of etching or abrading, it is preferable to previously set an initial film thickness of the second insulating film 8, illustrated in FIG. 19a, as much.

Figure 19C:
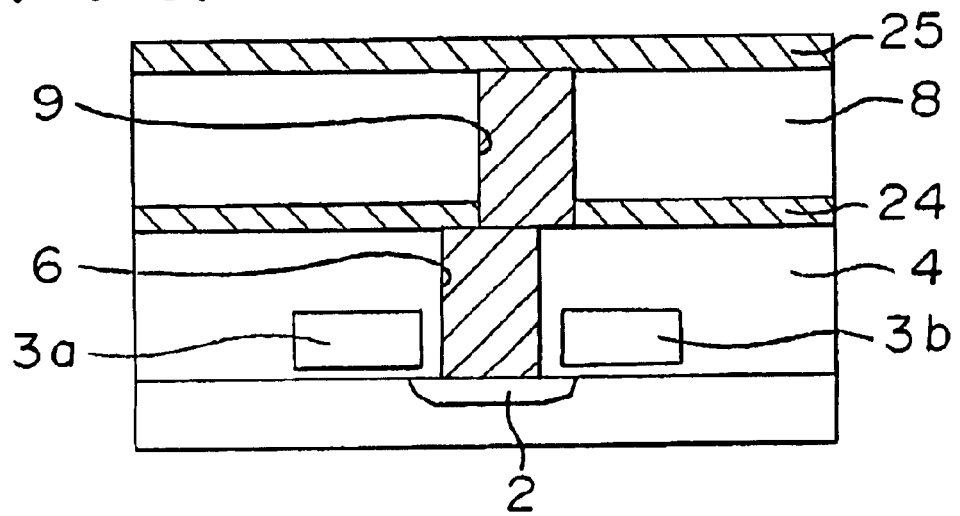
FIG. 19c is a cross-sectional view of the semiconductor device in a step of producing this according to Embodiment 6 of the present invention.

In FIG. 19c, the second etching prevention film 25, made of a silicon nitride film having high etch selectivity with respect to a third insulating film 14 having a thickness of 30 nm described below, is formed on the second insulating film 8 and the second conductive plug 9 by a low-pressure CVD method. Since the second etching prevention film 25 is formed on the flat surface, where the surfaces of the second insulating film 8 and the second conductive plug 7 are flat, the second etching prevention film 25 has a flat surface without unevenness.

Figure 20A:
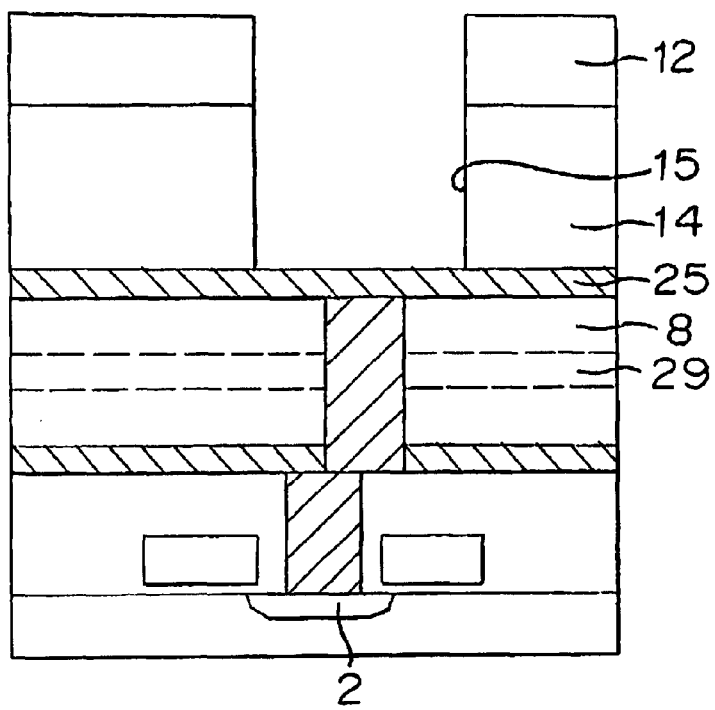
FIG. 20a is a cross-sectional view of the semiconductor device in a step of producing this according to Embodiment 6 of the present invention.

In FIG. 20a, a third insulating film 14, made of BPTEOS having a thickness of 150 nm, is formed on the second etching prevention film 25, and an opening 15 is formed under a pressure of 40 mT of a mixed gas of $C_4F_8$, CO, and Ar, of which gas flow rates are respectively 10, 10, and 150 sccm, using a resist film 12 having a predetermined contact pattern, which is formed on the third insulating film 14 as an etching mask.

Because the second etching prevention film 25 has high etch selectivity with respect to the second insulating film 8, etching of the opening 15 is stopped on a surface of the second etching prevention film 25. Therefore, the opening 15 does not reach a bit wire 29 formed in the second insulating film 8 by penetrating the second insulating film 8, which is the same type as the third insulating film 15.

Figure 20B:
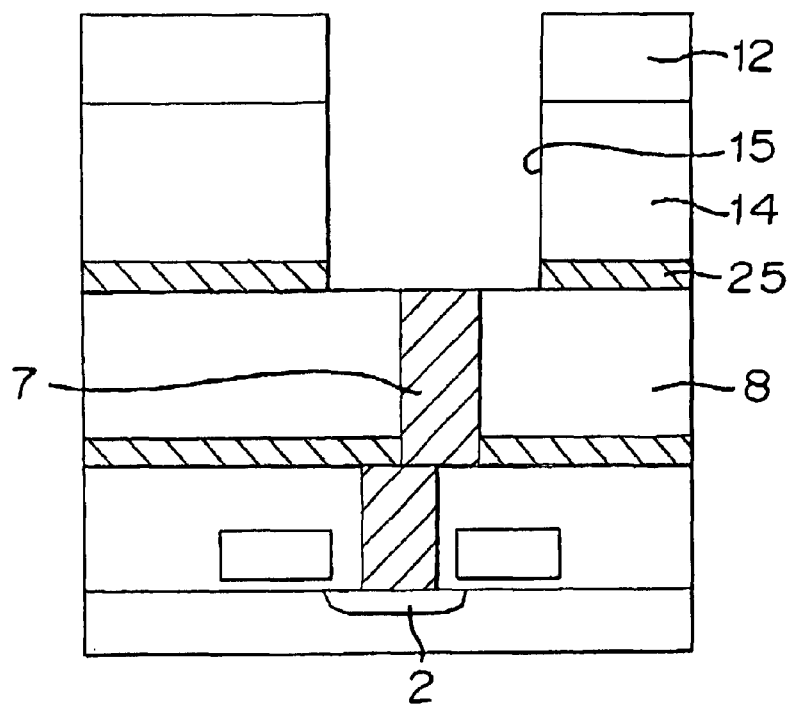
FIG. 20b is a cross-sectional view of the semiconductor device in a step of producing this according to Embodiment 5 of the present invention.

In FIG. 20b, after etching the opening 15 as above, the opening 15 is connected to the second conductive plug 10 by etching the second etching prevention film 25 exposed to a surface of the opening 15 under a pressure of 40 mT of a mixed gas of $CHF_3$, $O_2$, and Ar, of which gas flow rates are respectively 30, 30, and 600 sccm.

Since the surface of the second etching prevention film 25 exposed to the surface of the opening 15 is flat as described, the second etching prevention film 25 is not left as a residue on the surface of the second conductive plug 10 by this etching.

Further, because the second etching prevention film 25 is thin, it is possible to control etching of the second insulating film 8 exposed to the opening 15 so as not to reach a bit wire formed in the second insulating film 8.

Figure 21:
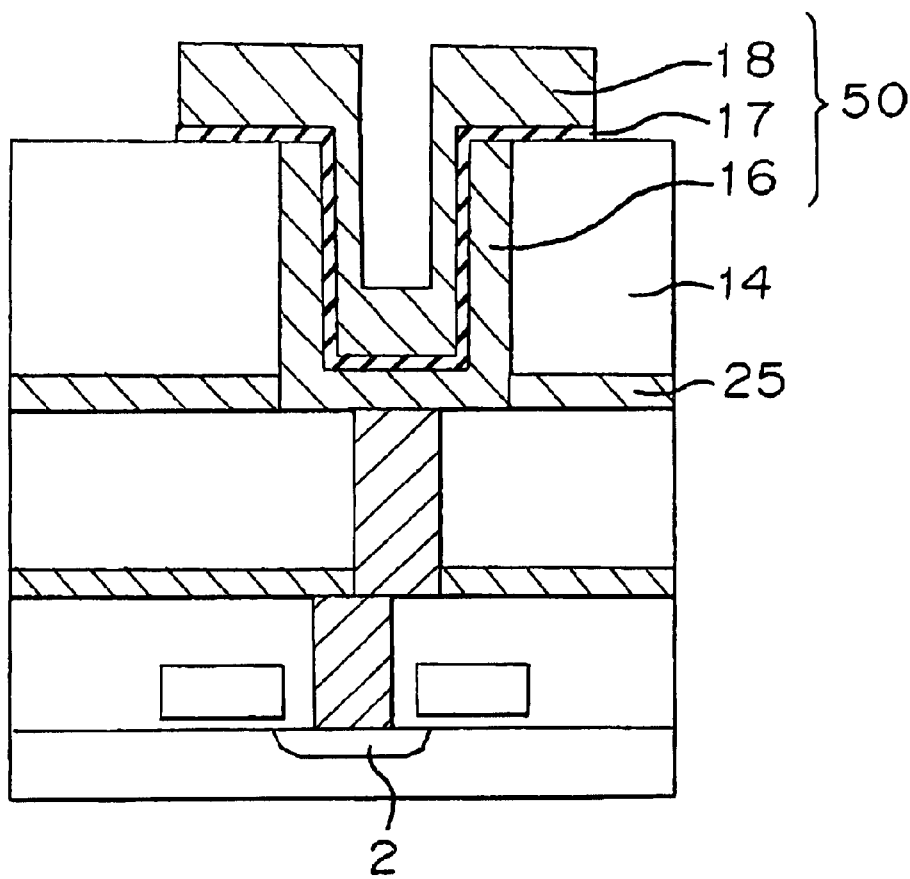
FIG. 21 is a cross-sectional view of the semiconductor device in a step of producing this according to Embodiment 6 of the present invention.
Figure 22:
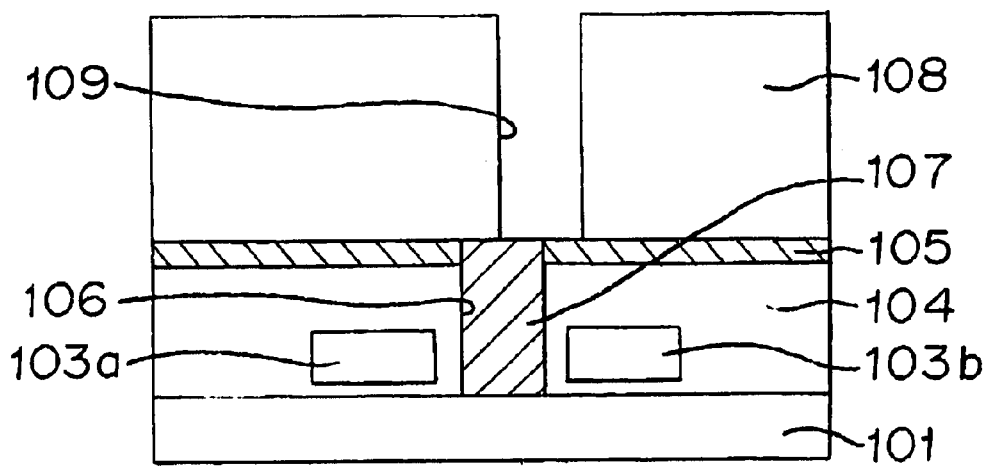
FIG. 22 is a cross-sectional view of a conventional semiconductor device in a step of producing this.
Figure 23:
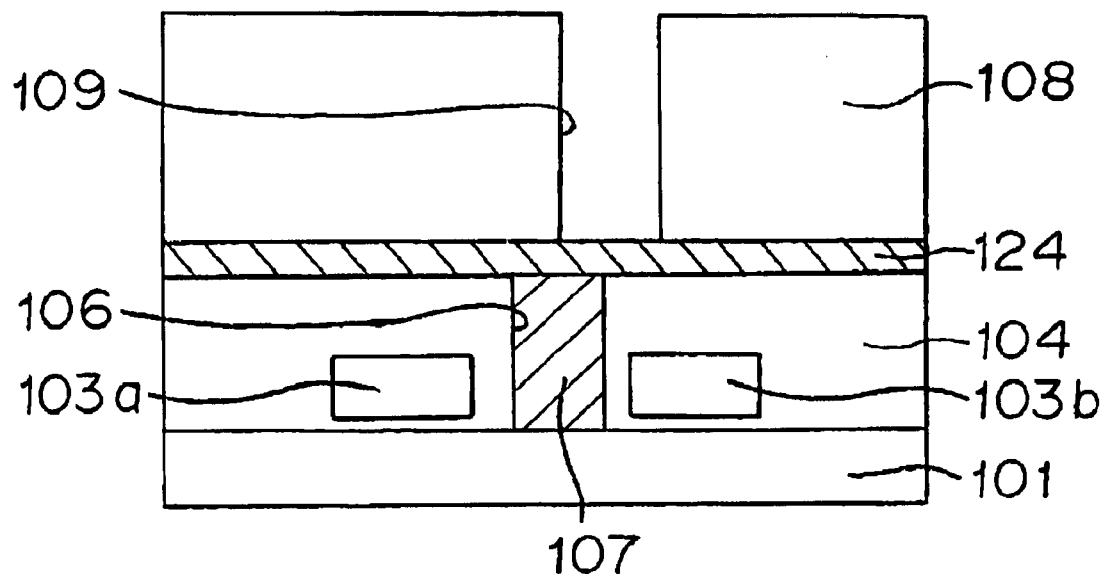
FIG. 23a is a cross-sectional view of the conventional semiconductor device in a step of producing this.
FIG. 23b is a cross-sectional view of the conventional semiconductor device in a step of producing this.
Figure 23:
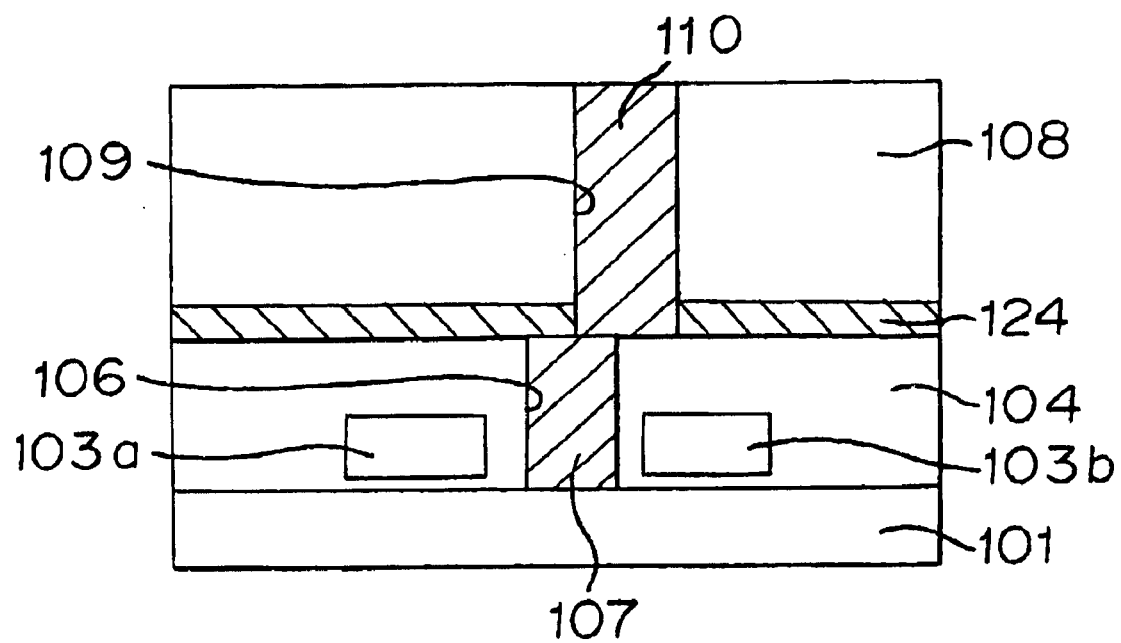
Figure 24:
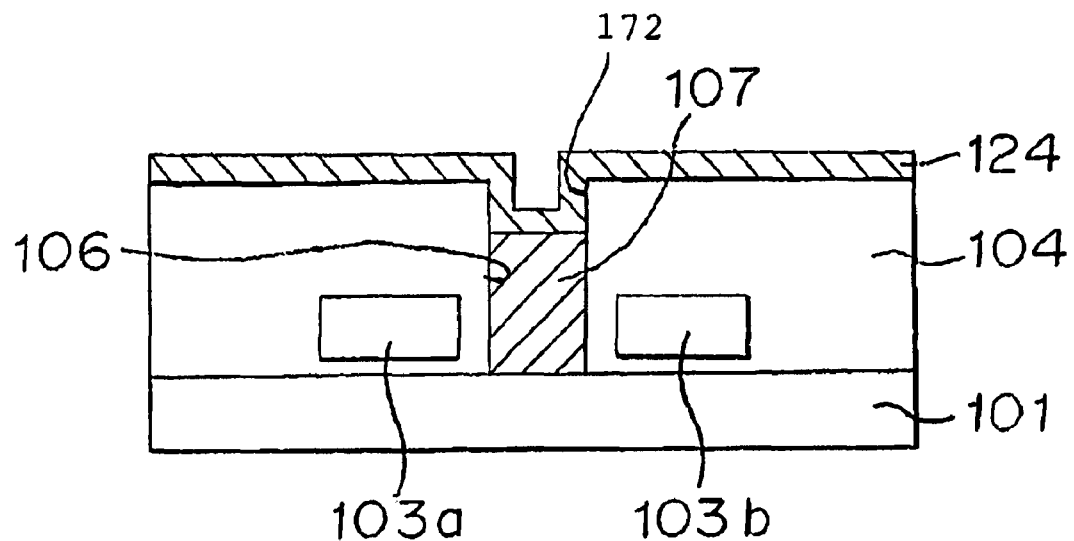
FIG. 24a is a cross-sectional view of a semiconductor device in a step of producing this for explaining a problem in a conventional technique.
FIG. 24b is a cross-sectional view of the semiconductor device in a step of producing this for explaining a problem of the conventional technique.
Figure 24:
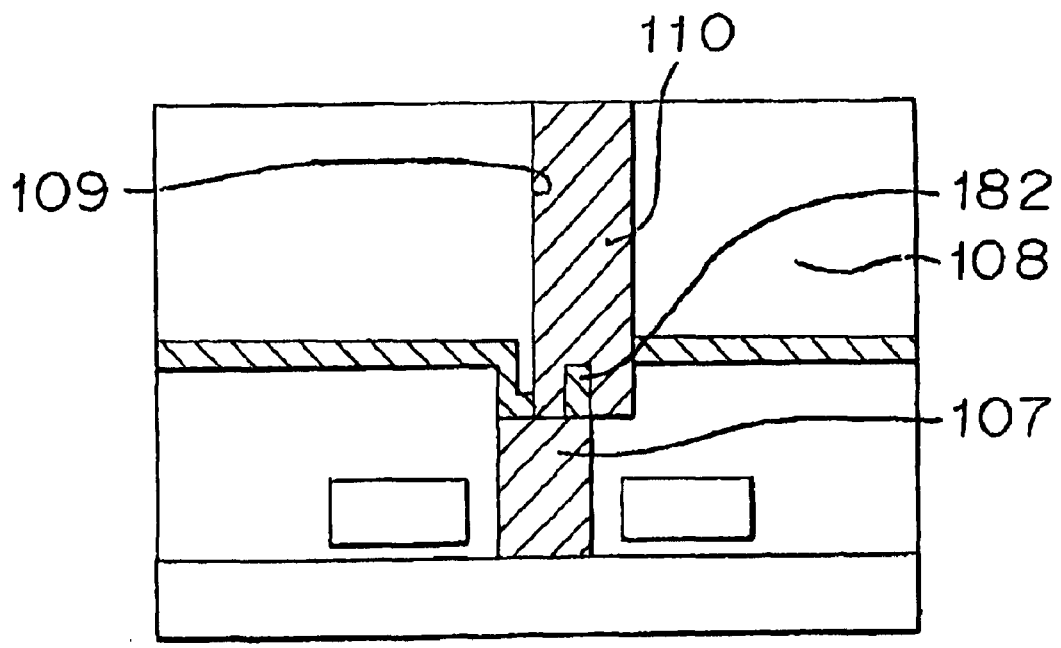

In FIG. 21, a capacitor 50 including a storage node electrode 16, a capacitor dielectric film 17, and a cell plate electrode 18 is formed in the aperture 15 and on the third insulating film 14.

As described, according to Embodiment 6 of the present invention, since the second etching prevention film is formed on the flat surface without a drop of the second conductive plug, even though the second etching prevention film is etched, it does not left as a residue between the second conductive plug and the capacitor electrode. As a result, it is possible to suppress a contact resistance between the capacitor electrode and the second conductive plug, whereby the semiconductor device having the contact structure of a capacitor with high reliability is obtainable.

The first advantage of the semiconductor device according to the present invention is that a highly reliable contact structure, in which the conductive plug and the electrode layer are not shorted and the conductive plugs are preferably connected, is included.

The second advantage of the semiconductor device according to the present invention is that a highly reliable contact structure, in which the conductive plugs are further preferably connected, is included.

The third advantage of the semiconductor device according to the present invention is that a capacitor having a highly reliable contact structure, in which the conductive plugs are further preferably connected, is included.

The fourth advantage of the semiconductor device according to the present invention is that a multi-layer wiring having a highly reliable contact structure, in which the conductive plugs and the electrode layer are not shorted, and the conductive plugs and the wires are preferably connected, is included.

The fifth advantage of the semiconductor device according to the present invention is that a multi-layer wiring having a highly reliable contact structure, in which the conductive plugs and the wires are further preferably connected, is included.

The sixth advantage of the semiconductor device according to the present invention is that an accuracy of the resist film formed on the anti-reflection coating is further enhanced with a higher reliability The seventh advantage of the method of producing the semiconductor device according to the present invention is that the semiconductor device having a highly reliable contact structure, in which the conductive plugs and the electrode layer are not shorted and the conductive plugs are preferably connected, is obtainable.

The eighth advantage of the method of producing the semiconductor device according to the present invention is that the semiconductor device having a highly reliable contact structure, in which the conductive plugs are preferably connected, is obtainable.

The ninth advantage of the method of producing the semiconductor device according to the present invention is that the semiconductor device including the capacitor having a highly reliable contact structure, in which the conductive plugs are further preferably connected, is obtainable.

The tenth advantage of the method of producing the semiconductor device according to the present invention is that an accuracy of the resist film formed on the anti-reflection coating is further enhanced with a higher reliability.

The eleventh advantage of the method of producing the semiconductor device according to the present invention is that the semiconductor device having a highly reliable contact structure, in which a contact resistance between the conductive plugs is low, is obtainable.

The twelfth advantage of the method of producing the semiconductor device according to the present invention is that the semiconductor device including the capacitor having a highly reliable contact structure, in which the conductive plugs are preferably connected, is obtainable.

Obviously, numerous modifications and variations of the present invention are possible in light of the above teachings. It is therefore to be understood that within the scope of the appended claims, the invention may be practiced otherwise than as specifically described herein.

What is claimed is:

1. The semiconductor device comprising:

an electrode layer formed on a part of a semiconductor layer;

a first insulating layer formed by covering said semiconductor layer and said electrode layer and by sequentially laminating a first insulating film and a first anti-reflection coating;

a first contact hole formed in said first insulating layer and reaching said semiconductor layer by penetrating a vicinity of a side of said electrode layer from a surface of said first insulating layer;

a first conductive plug embedded in said first contact hole and electrically connected to said semiconductor layer;

a first wiring layer electrically connected to said semiconductor layer through said first conductive plug and formed on said first conductive plug;

a second insulating layer formed by covering said first insulating layer and said first wiring layer;

a second contact hole formed in said second insulating layer and reaching said first wiring layer and said first insulating layer from a surface of said second insulating layer;

a second conductive plug embedded in said second contact hole and electrically connected to said first wiring layer; and a second wiring layer electrically connected to said first wiring layer through said second conductive plug and formed on said second conductive plug.

2. The semiconductor device according to claim 1, wherein said second insulating layer includes a second insulating film and a second anti-reflection coating formed on said second insulating film.

3. The semiconductor device according to claim 2, wherein said first anti-reflection coating and said second anti-reflection coating are a silicon oxynitride film.

4. The semiconductor device according to claim 1, wherein said first anti-reflection coating and said second anti-reflection coating are a silicon oxynitride film.

* * * * *